(12) United States Patent
Nagata et al.

(10) Patent No.: US 10,761,150 B2
(45) Date of Patent: Sep. 1, 2020

(54) MAGNETIC FIELD DETECTION DEVICE

(71) Applicant: TDK CORPORATION, Tokyo (JP)

(72) Inventors: Masaki Nagata, Tokyo (JP); Kazuya Watanabe, Tokyo (JP); Keisuke Uchida, Tokyo (JP); Kohei Honma, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/688,093

(22) Filed: Aug. 28, 2017

(65) Prior Publication Data

US 2018/0113176 A1    Apr. 26, 2018

(30) Foreign Application Priority Data

Oct. 25, 2016 (JP) ................................. 2016-208785

(51) Int. Cl.
*G01R 33/00* (2006.01)
*G01R 33/02* (2006.01)

(52) U.S. Cl.
CPC ..... *G01R 33/0005* (2013.01); *G01R 33/0206* (2013.01)

(58) Field of Classification Search
CPC .......................... G01R 33/0005; G01R 33/0206
See application file for complete search history.

(56) References Cited

U.S. PATENT DOCUMENTS

| 6,144,524 | A | * | 11/2000 | Haratani | ................ | B82Y 10/00 |
| | | | | | | 257/E43.004 |
| 7,405,560 | B2 | | 7/2008 | Shimizu et al. | | |
| 8,378,674 | B2 | | 2/2013 | Furukawa et al. | | |
| 8,957,679 | B2 | * | 2/2015 | Loreit | ...................... | G01D 1/00 |
| | | | | | | 324/244 |
| 9,086,444 | B2 | | 7/2015 | Nakajima et al. | | |
| 2007/0048485 | A1 | * | 3/2007 | Jogo | ...................... | B82Y 25/00 |
| | | | | | | 428/64.1 |
| 2008/0061773 | A1 | * | 3/2008 | Otagiri | ................... | B82Y 25/00 |
| | | | | | | 324/210 |
| 2015/0028863 | A1 | | 1/2015 | Zeyen | | |

FOREIGN PATENT DOCUMENTS

| JP | S56-004877 U | | 1/1981 |
| JP | 04305810 A | * | 10/1992 |
| JP | 2003-069108 A | | 3/2003 |
| JP | 2003-142752 A | | 5/2003 |
| JP | 2003-262650 A | | 9/2003 |
| JP | 2003-318461 A | | 11/2003 |
| JP | 2004265517 A | * | 9/2004 |

(Continued)

*Primary Examiner* — Walter L Lindsay, Jr.
*Assistant Examiner* — Milton Gonzalez
(74) *Attorney, Agent, or Firm* — Oliff PLC

(57) ABSTRACT

Provided is a magnetic field detection device that includes a first and second soft magnetic bodies, and a magnetic detector. The first and second soft magnetic bodies extend along a first plane and are disposed in confronted relation in a third direction. The first plane includes both a first direction and a second direction orthogonal to the first direction. The third direction is orthogonal to both the first and second directions. The magnetic detector is provided between the first and second soft magnetic bodies in the third direction.

9 Claims, 19 Drawing Sheets

(56) References Cited

FOREIGN PATENT DOCUMENTS

| | | |
|---|---|---|
| JP | 2005-031000 A | 2/2005 |
| JP | 2007-194322 A | 8/2007 |
| JP | 2009-036579 A | 2/2009 |
| WO | 2008/146809 A1 | 12/2008 |
| WO | 2011/081197 A1 | 7/2011 |

* cited by examiner

MAGNETIC FIELD DETECTION DEVICE

CROSS REFERENCE TO RELATED APPLICATIONS

This application claims the benefit of Japanese Priority Patent Application JP2016-208785 filed on Oct. 25, 2016, the entire contents of which are incorporated herein by reference.

BACKGROUND

The invention relates to a magnetic field detection device that detects a magnetic field using a magnetic detector.

Magnetic field detection devices detect external magnetic fields. As the magnetic field detection devices, known are those that utilize Hall elements or magneto-resistive effect elements. For example, reference is made to International Publication No. WO2008/146809.

SUMMARY

In recent years, there has been a desire for enhancement in performance of magnetic field detection. It is therefore desirable to provide a magnetic field detection device that has more optimal performance of magnetic field detection.

A magnetic field detection device according to an illustrative embodiment of the invention includes a first soft magnetic body and a second soft magnetic body, and a magnetic detector. The first soft magnetic body and the second soft magnetic body extend along a first plane and are disposed in confronted relation in a third direction. The first plane includes both a first direction and a second direction orthogonal to the first direction. The third direction is orthogonal to both the first direction and the second direction. The magnetic detector is provided between the first soft magnetic body and the second soft magnetic body in the third direction.

DETAILED DESCRIPTION

Some example embodiments of the invention are described in detail below with reference to the accompanying drawings. The description is given in the following order.

1. First Embodiment

An example of a magnetic field detection device including a pair of soft magnetic layers each including a flat surface 2. Second Embodiment and its Modification Examples 2.1 An example of a magnetic field detection device including a pair of soft magnetic layers each including a flat surface and a protrusion provided thereon 2.2 First Modification Example (an example of a magnetic field detection device including a plurality of magnetic detectors interposed between a pair of soft magnetic layers)

2.3 Second Modification Example (an example with the protrusions provided solely on one of the soft magnetic layers)

2.4 Third Modification Example (an example in which the soft magnetic layers including the protrusions of other shapes)

2.5 Fourth Modification Example (an example with the protrusions arranged at different pitches on the pair of the soft magnetic layers)

3. Experimental Examples

4. Other Modification Examples

[1. First Embodiment]

[Configuration of Magnetic Field Detection Device 1]

Figure 1A:
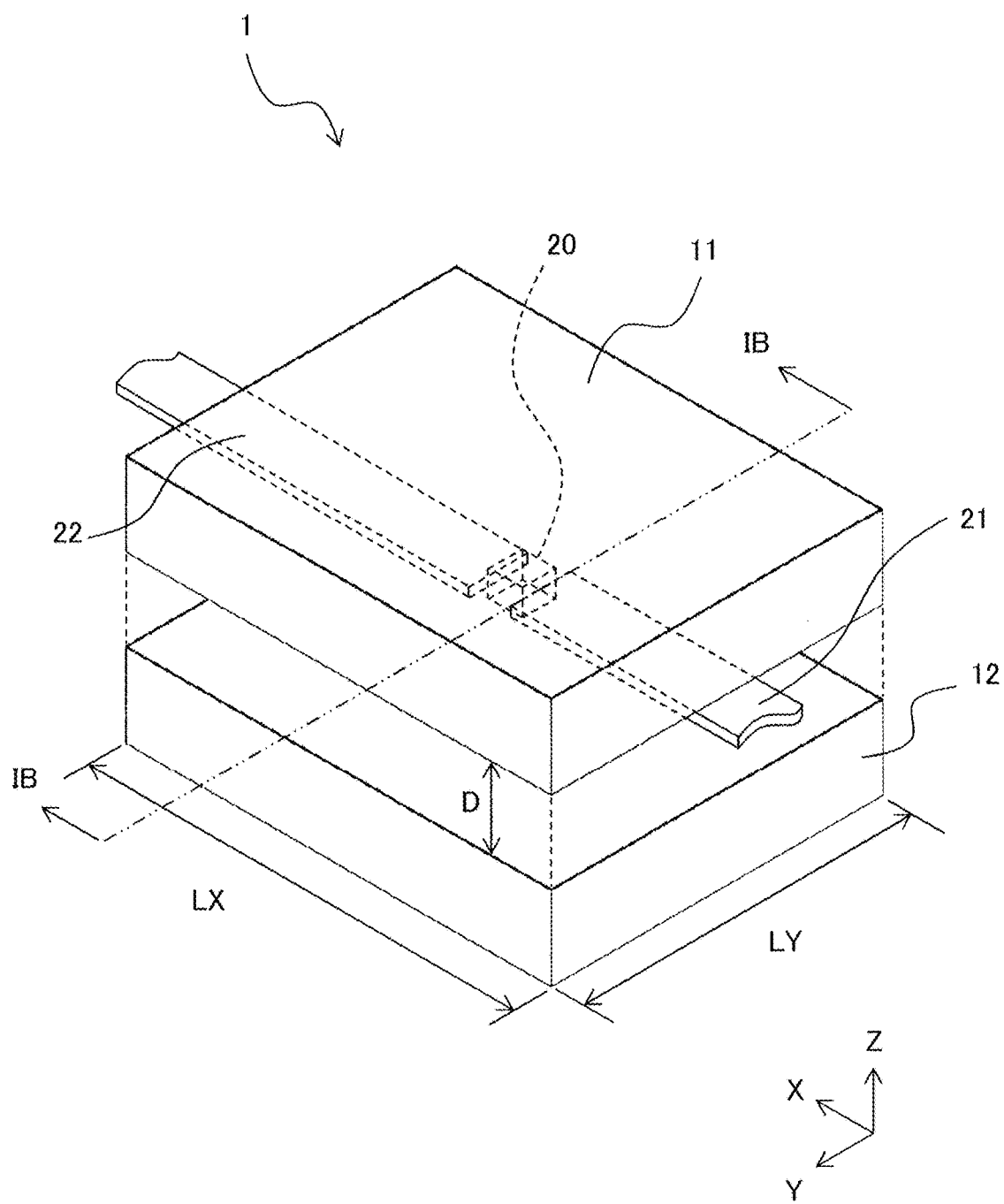
FIG. 1A is a schematic perspective view of an overall configuration of a magnetic field detection device according to a first embodiment of the invention.
Figure 1B:
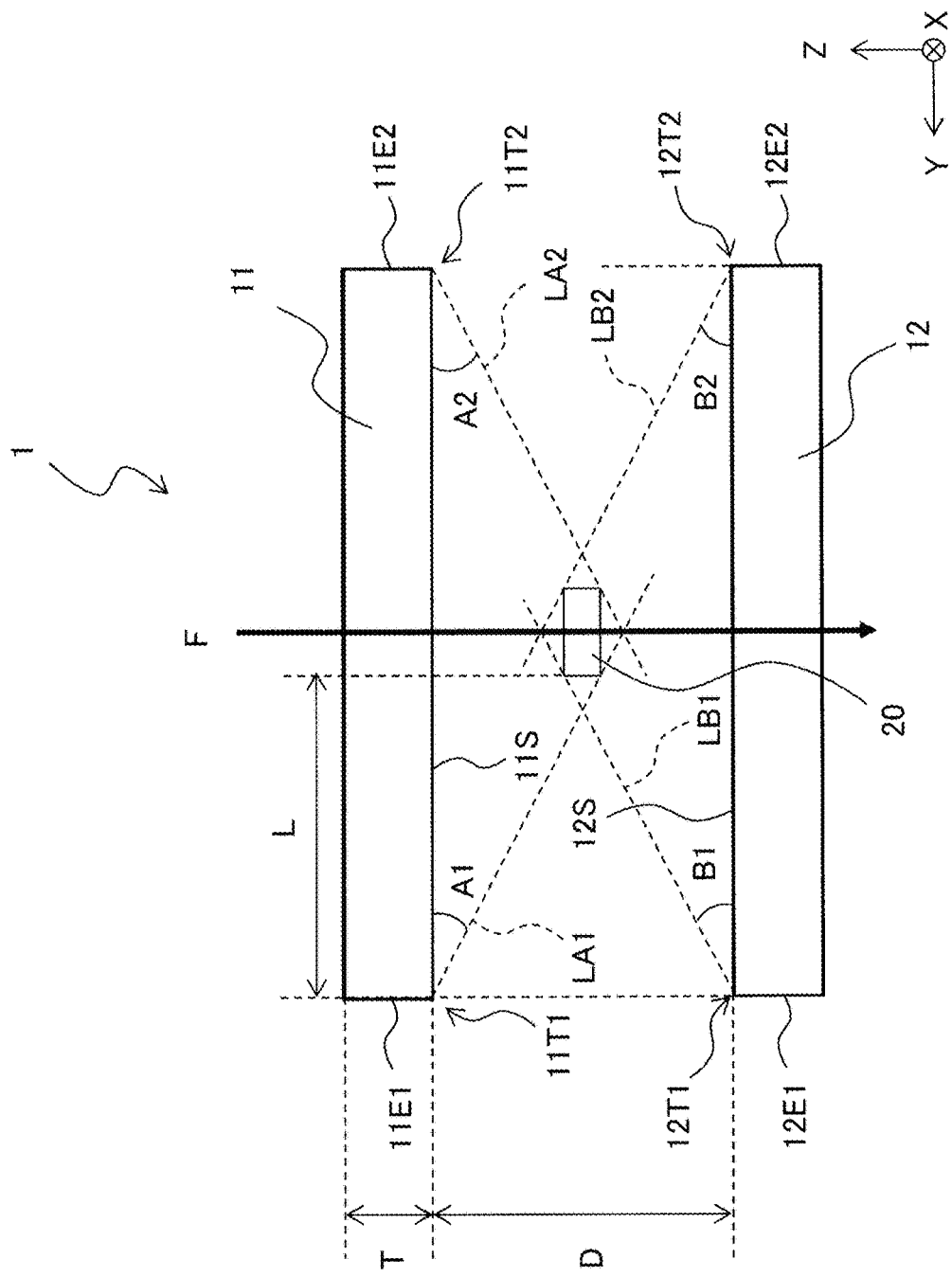
FIG. 1B is a cross-sectional view of a cross-sectional configuration of the magnetic field detection device illustrated in FIG. 1A.
Figure 2:
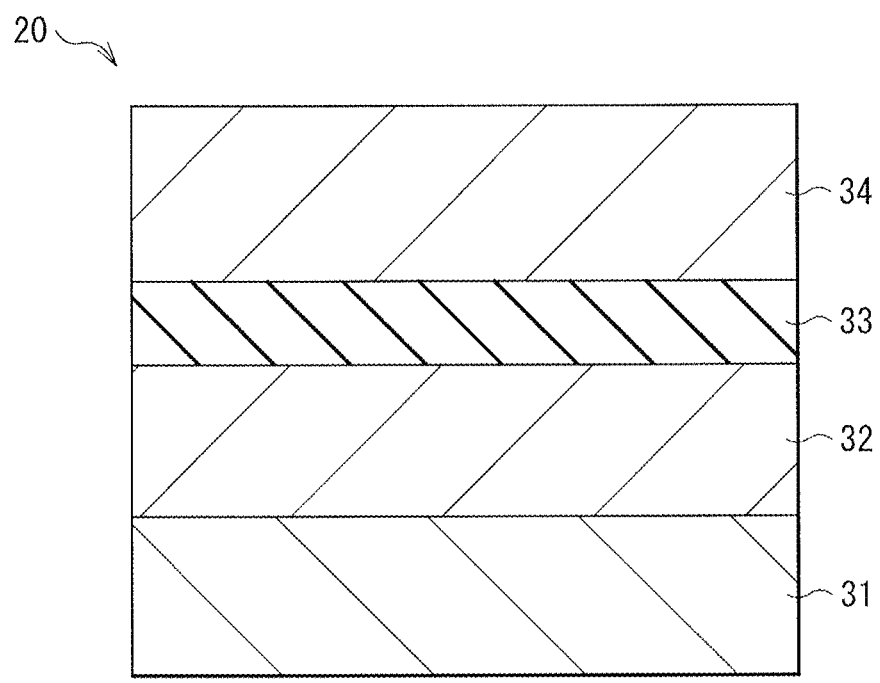
FIG. 2 is an enlarged cross-sectional view of a cross-sectional configuration of a magnetic detector illustrated in FIG. 1A.

Description is given first of a configuration of a magnetic field detection device 1 according to a first embodiment of the invention, with reference to the figures such as FIGS. 1A, 1B, and 2. FIG. 1A is a perspective view of an example of an overall configuration of the magnetic field detection device 1. FIG. 1B illustrates an example of a cross-sectional configuration of the magnetic field detection device 1 viewed in a direction of an arrow along a line IB-IB illustrated in FIG. 1A. FIG. 2 illustrates an example of a cross-sectional configuration of a magnetic detector 20 illustrated in FIGS. 1A and 1B.

The magnetic field detection device 1 may be a device that detects presence or absence of an external magnetic field that covers the magnetic field detection device 1 itself, and detects a direction or strength, or other properties of the external magnetic field. The magnetic field detection device 1 may be mounted on an electromagnetic compass, without limitation. The magnetic field detection device 1 includes a pair of soft magnetic layers 11 and 12, and the magnetic detector 20. The pair of the soft magnetic layers 11 and 12 are disposed in confronted relation in, for example, a Z axis direction. The magnetic detector 20 is provided between the soft magnetic layer 11 and the soft magnetic layer 12 in the Z axis direction. The magnetic field detection device 1 may further include leads 21 and 22 that cause a sense current to flow to the magnetic detector 20. It is to be noted that in FIG. 2, illustration of the leads 21 and 22 is omitted.

[Soft Magnetic Layers 11 and 12]

The soft magnetic layers 11 and 12 both extend along an X-Y plane that is orthogonal to the Z axis direction. The soft magnetic layers 11 and 12 may be made of, for example but not limited to, a soft magnetic metal material having high saturation magnetic flux density, e.g., a nickel-iron alloy (Ni—Fe). As illustrated in FIG. 1A, the soft magnetic layers 11 and 12 are rectangular in planar shapes in the X-Y plane. In one preferable but non-limiting example, a ratio (LX/LY) of a dimension LX to a dimension LY may range from 1 to 4 both inclusive, in which LX denotes a dimension in an X axis direction, and LY denotes a dimension in a Y axis direction. In other words, in one preferable but non-limiting example, the following conditional expression [1] may be satisfied, $$1 \leq LX/LY \leq 4 \quad [1]$$

This makes it possible for the soft magnetic layers 11 and 12 to serve as magnetic shields that restrain more effectively an external magnetic field in the Y axis direction from covering the magnetic detector 20. Accordingly, in using the magnetic field detection device 1, in one preferable but non-limiting example, the Y axis direction may coincide with a direction of an unwanted external magnetic field component in a different direction from an external magnetic field component as a target of detection. Setting a posture or orientation of the magnetic field detection device 1 in this way makes it possible to magnetically shield the magnetic detector 20 against the unwanted external magnetic field component. The soft magnetic layer 11 may include a flat surface 11S that is confronted with the soft magnetic layer 12, whereas the soft magnetic layer 12 may include a flat surface 12S that is confronted with the soft magnetic layer 11. Both the flat surface 11S and the flat surface 12S may be substantially parallel to the X-Y plane.

[Magnetic Detector 20]

The magnetic detector 20 may be, for example but not limited to, a magneto-resistive effect (MR) element that exhibits a change in resistance in accordance with the direction or the strength of the external magnetic field. As illustrated in, for example, FIG. 2, the magnetic detector 20 may be a current perpendicular to plane (CPP) MR element of a spin valve structure including a stack of a plurality of functional films including a magnetic layer, and allow the sense current to flow through an inside of itself in a stacking direction. In one specific but non-limiting example, as illustrated in FIG. 2, the magnetic detector 20 may include a stacked body in which an antiferromagnetic layer 31, a magnetization fixed layer 32, an intermediate layer 33, and a magnetization free layer 34 are stacked in order. The magnetization fixed layer 32 may have magnetization fixed in a constant direction. The intermediate layer 33 may exhibit no specific direction of magnetization. The magnetization free layer 34 may have magnetization that changes with the external magnetic field. It is to be noted that the antiferromagnetic layer 31, the magnetization fixed layer 32, the intermediate layer 33, and the magnetization free layer 34 may each have either a single-layer structure or a multi-layered structure including a plurality of layers. In the MR element as described above, the change in resistance occurs in accordance with a change in a magnetic flux along an in-plane direction of the films that is orthogonal to the stacking direction. In one preferable but non-limiting example, as described in and after a second embodiment, with the stacking direction of the magnetic detector 20 being the Z axis direction in the magnetic field detection device 1, protrusions or other structures may be provided, in order to cause the change in the resistance to occur in accordance with the change in a magnetic flux F (FIG. 1B) in the Z axis direction. The protrusions or other structures may be able to bend, in the vicinity of the magnetic detector 20, a direction of the magnetic flux F along an in-plane direction of the X-Y plane. The in-plane direction of the X-Y plane serves as direction of magnetic sensing.

The antiferromagnetic layer 31 may be made of an antiferromagnetic material such as a platinum-manganese alloy (Pt—Mn) and an iridium-manganese alloy (Ir—Mn). The antiferromagnetic layer 31 may be in a state in which, for example, a spin magnetic moment in the substantially same direction as the direction of the magnetization of the magnetization fixed layer 32 in adjacency thereto and a spin magnetic moment in an opposite direction thereto cancel each other completely. Thus, the antiferromagnetic layer 31 may act to fix the direction of the magnetization of the magnetization fixed layer 32 in the constant direction.

The magnetization fixed layer 32 may be made of a ferromagnetic material such as cobalt (Co), a cobalt-iron alloy (Co—Fe), a cobalt-iron-boron alloy (Co—Fe—B).

The intermediate layer 33 may be a non-magnetic tunnel barrier layer made of, for example but not limited to, magnesium oxide (MgO), in a case where the magnetic detector 20 is a magnetic tunneling junction (MTJ) element. The intermediate layer 33 may be thin enough to allow a tunneling current based on quantum mechanics to pass through. The MgO tunneling barrier layer may be produced by, for example, a sputtering process using an MgO target. In addition, the MgO tunneling barrier layer may be produced by an oxidization process of a magnesium (Mg) thin film, or a reactive sputtering process that involves magnesium sputtering in an oxygen atmosphere. Moreover, in addition to MgO, the intermediate layer 33 may be constituted with the utilization of an oxide or a nitride of aluminum (Al), tantalum (Ta), and/or hafnium (Hf). Furthermore, the intermediate layer 33 may be made of a non-magnetic highly conductive material such as copper (Cu), ruthenium (Ru), and gold (Au), in a case where the magnetic detector 20 is, for example, a giant magnetoresistive (GMR) element.

The magnetization free layer 34 may be a soft ferromagnetic layer, and have an axis of easy magnetization that is substantially orthogonal to, for example, the direction of the magnetization of the magnetization fixed layer 32. The magnetization free layer 34 may be made of, for example but not limited to, the cobalt-iron alloy (Co—Fe), the nickel-iron alloy (Ni—Fe), or the cobalt-iron-boron alloy (Co—Fe—B).

[Leads 21 and 22]

The lead 21 may extend in the X-Y plane, to be in contact with one end surface of the magnetic detector 20, e.g., the magnetization free layer 34. The lead 22 may extend in the X-Y plane, to be in contact with another end surface of the magnetic detector 20, e.g., the antiferromagnetic layer 31. The leads 21 and 22 may be made of, for example but not limited to, a highly conductive non-magnetic material such as copper and aluminum (Al).

[Arrangement Position of Magnetic Detector 20]

As illustrated in FIG. 1B, in the magnetic field detection device 1, in one preferable but non-limiting example, angles A1 and A2 formed by straight lines LA1 and LA2 with respect to the flat surface 11S may each be equal to or smaller than 45°. The straight line LA1 and LA2 respectively couple the magnetic detector 20 to edges 11T1 and 11T2 of the flat surface 11S. The edges 11T1 and 11T2 are located on both ends of the flat surface 11S in the Y axis direction. Furthermore, angles B1 and B2 formed by straight lines LB1 and LB2 with respect to the flat surface 12S may each be equal to or smaller than 45°. The straight lines LB1 and LB2 respectively couple the magnetic detector 20 to edges 12T1 and 12T2 of the flat surface 12S. The edges 12T1 and 12T2 are located on both ends of the flat surface 12S in the Y axis direction. In other words, in one preferable but non-limiting example, the magnetic detector 20 may be disposed in space surrounded by the four straight lines LA1, LA2, LB1, and LB2 illustrated in FIG. 1B. This makes it possible for the soft magnetic layers 11 and 12 to sufficiently shield the magnetic detector 20 against the external magnetic field component in the Y axis direction. It is to be noted that as illustrated in FIG. 1B, the edge 11T1 may be a part where an end surface 11E1 and the flat surface 11S cross each other. The edge 11T2 may be a part where an end surface 11E2 and the flat surface 11S cross each other. Likewise, the edge 12T1 may be a part where an end surface 12E1 and the flat surface 12S cross each other. The edge 12T2 may be a part where an end surface 12E2 and the flat surface 12S cross each other. The edges 11T1, 11T2, 12T1, and 12T2 may all extend straightly in the X axis direction.

In one preferable but non-limiting example, as illustrated in FIG. 1B, in a case where in the Z axis direction, positions of the edges 11T1 and 11T2 of the soft magnetic layer 11 and positions of the edges 12T1 and 12T2 of the soft magnetic layer 12 substantially coincide with each other, the following conditional expression [2] may be satisfied. This makes it possible, in this case as well, to shield the magnetic detector 20 against the external magnetic field component in the Y axis direction.

$$L \geq D/2 \quad [2]$$

In the expression, L denotes a distance from the edge 11T1 or 11T2 to the magnetic detector 20 in the Y axis direction, and D denotes a distance from the flat surface 11S to the flat surface 12S (refer to FIG. 1B).

[Signal Detection Circuit]

Figure 3:
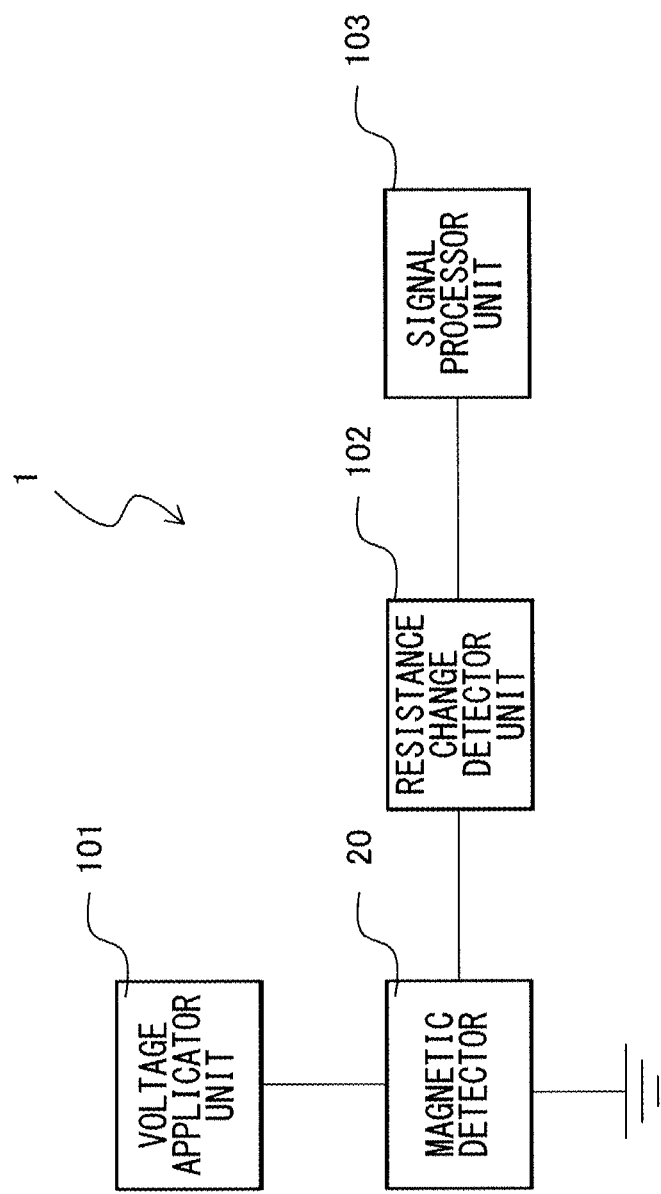
FIG. 3 is a circuit diagram of an example of a signal detection circuit mounted on the magnetic field detection device illustrated in FIG. 1A.

The magnetic field detection device 1 may include a signal detection circuit as illustrated in, for example, FIG. 3. The signal detection circuit may include, for example but not limited to, a voltage applicator unit 101, the magnetic detector 20, a resistance change detector unit 102, and a signal processor unit 103. The voltage applicator unit 101 and the resistance change detector unit 102 may be coupled to the magnetic detector 20. The signal processor unit 103 may be coupled to the resistance change detector unit 102.

[Workings and Effects of Magnetic Field Detection Device 1]

In the magnetic field detection device 1, by the signal detection circuit as described above, obtained is an output in accordance with the external magnetic field that covers the magnetic field detection device 1. In one specific but non-limiting example, in the signal detection circuit as mentioned above, a predetermined voltage is applied by the voltage applicator unit 101 to between the lead 21 and the lead 22, causing the flow of the sense current that corresponds to electrical resistance of the magnetic detector 20 at that time. The electrical resistance of the magnetic detector 20 changes with a state of magnetization of the magnetic detector 20, i.e., the direction of the magnetization of the magnetization free layer 34 with respect to the direction of the magnetization of the magnetization fixed layer 32. The sense current that flows through the magnetic detector 20 is detected in the resistance change detector unit 102, causing a signal to be outputted by the resistance change detector unit 102 to the signal processor unit 103. Furthermore, in the signal processor unit 103, generated is a signal based on the output from the resistance change detector unit 102. The signal thus generated is outputted to outside. Thus, an output in accordance with the external magnetic field that covers the magnetic field detection device 1 is obtained from the signal detection circuit.

In the magnetic field detection device 1 according to this embodiment, the pair of the soft magnetic layers 11 and 12 are provided. The soft magnetic layer 11 and the soft magnetic layer 12 are disposed in confronted relation, with the magnetic detector 20 interposed therebetween in the Z axis direction. Accordingly, the soft magnetic layer 11 and the soft magnetic layer 12 both act as magnetic yokes with respect to the external magnetic field component in the Z axis direction. Meanwhile, the soft magnetic layer 11 and the soft magnetic layer 12 both act as magnetic shields against the external magnetic field component in the Y axis direction. In other words, according to the magnetic field detection device 1, the soft magnetic layer 11 and the soft magnetic layer 12 exhibit a shielding effect against the external magnetic field component in the Y axis direction, while enhancing the external magnetic field component in the Z axis direction. Hence, it is possible to exhibit high performance in the magnetic field detection with respect to the external magnetic field component in the Z axis direction.

[2. Second Embodiment]
[2.1 Magnetic Field Detection Device 2]

Figure 4A:
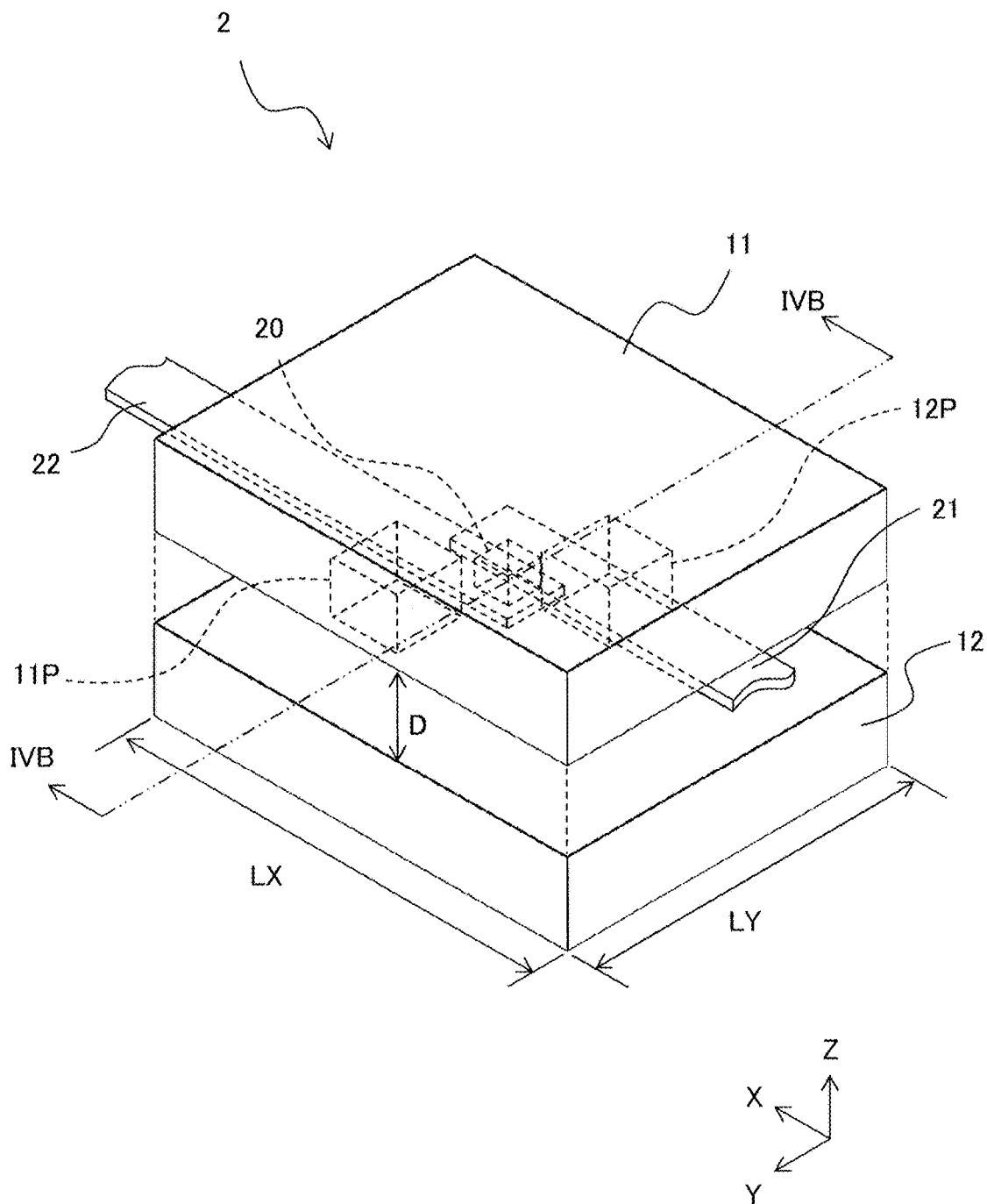
FIG. 4A is a schematic perspective view of an overall configuration of a magnetic field detection device according to a second embodiment of the invention.
Figure 4B:
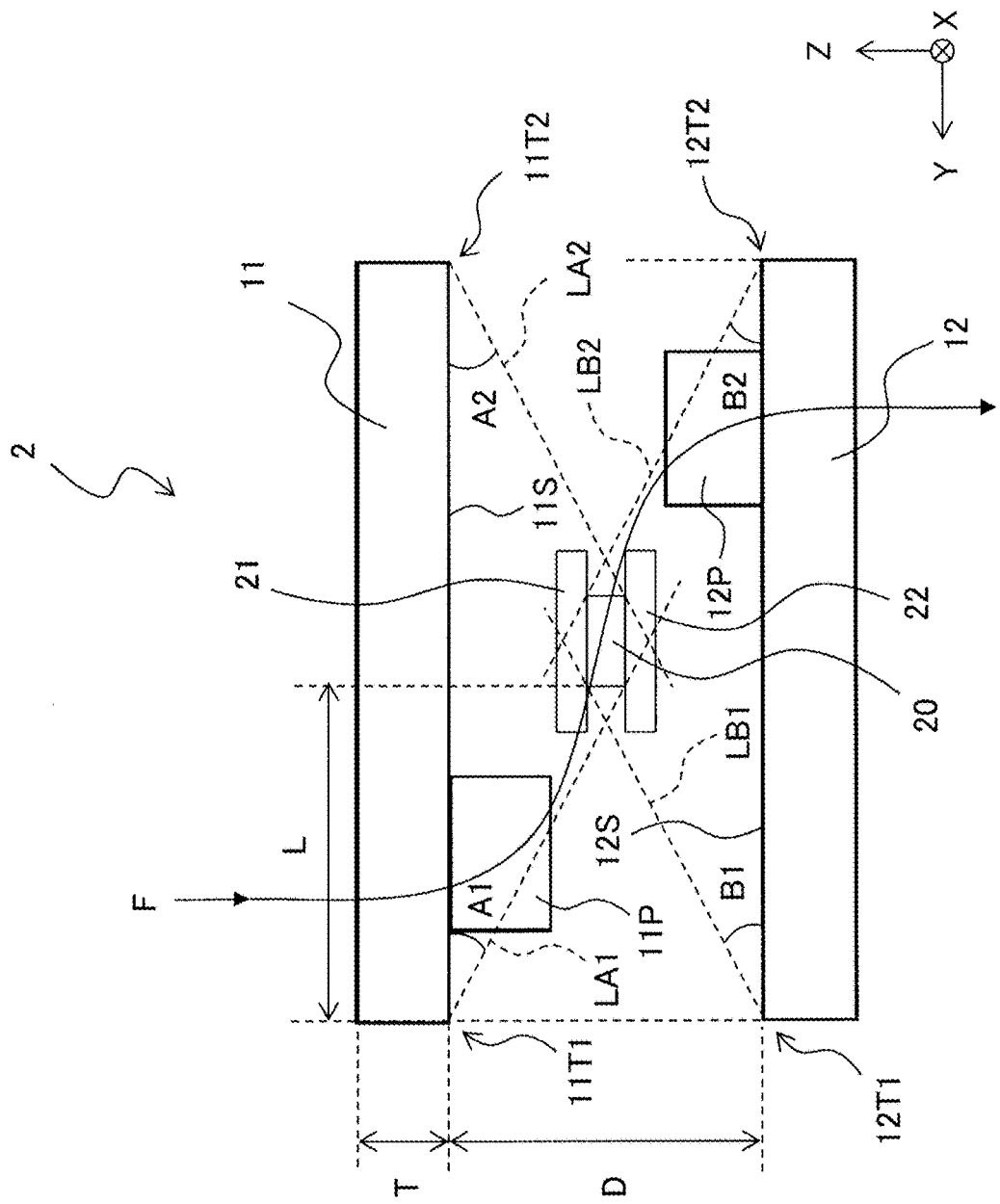
FIG. 4B is a cross-sectional view of a cross-sectional configuration of the magnetic field detection device illustrated in FIG. 4A.

Description is given next of a configuration of a magnetic field detection device 2 according to a second embodiment of the invention, with reference to FIGS. 4A and 4B. FIG. 4A is a perspective view of an example of an overall configuration of the magnetic field detection device 2. FIG. 4B illustrates a configuration example of a Y-Z cross-section of the magnetic field detection device 2 viewed in a direction of an arrow along a line IVB-IVB illustrated in FIG. 4A.

In the magnetic field detection device 2 according to this embodiment, a protrusion 11P may be provided on the flat surface 11S of the soft magnetic layer 11, whereas a protrusion 12P may be provided on the flat surface 12S of the soft magnetic layer 12. Furthermore, the stacking direction of the MR element as the magnetic detector 20 may be the Z axis direction, with the lead 21 being coupled to an upper surface of the magnetic detector 20, and with the lead being coupled to a lower surface of the magnetic detector 20. Otherwise, the magnetic field detection device 2 may have substantially similar configurations to those of the magnetic field detection device 1 according to the forgoing first embodiment.

As illustrated in FIGS. 4A and 4B, the protrusion 11P may be vertically provided on the flat surface 11S, to protrude toward the flat surface 12S. Meanwhile, the protrusion 12P may be vertically provided on the flat surface 12S, to protrude toward the confronted flat surface 11S. However, the protrusion 11P and the protrusion 12P may be provided at different positions from each other in the X-Y plane. Moreover, the magnetic detector 20 may be disposed at a position interposed between the protrusion 11P and the protrusion 12P in the X-Y plane, and in the Y axis direction in this example.

As described, in the magnetic field detection device 2, the soft magnetic layers 11 and 12 may be respectively provided with the protrusions 11P and 12P. The magnetic detector 20 may be provided between the protrusions 11P and 12P. This makes it possible to allow the magnetic flux F caused by the external magnetic field component in the X axis direction to concentrate on the magnetic detector 20. At this occasion, it is possible to bend, in the vicinity of the magnetic detector 20, the direction of the magnetic flux F along the in-plane direction of the X-Y plane as the direction of the magnetic sensing of the magnetic detector 20. Hence, it is possible to allow a direction of extension of the soft magnetic layers 11 and 12 and a direction of extension of each layer of the magnetic detector 20 to substantially coincide with each other, leading to easier manufacture.

[2.2 Magnetic Field Detection Device 2A]

Figure 5A:
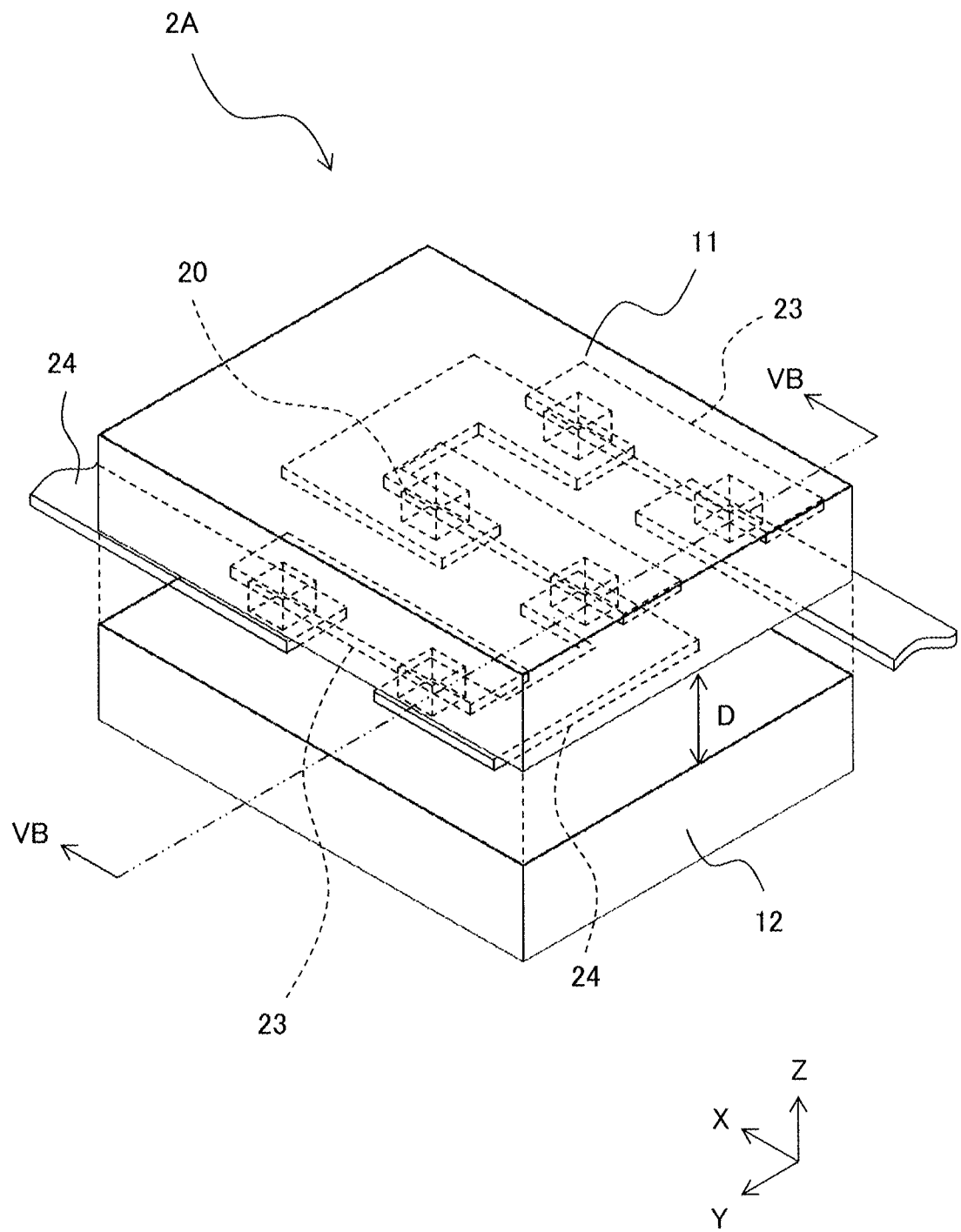
FIG. 5A is a perspective view of a modification example (a first modification example) of the magnetic field detection device illustrated in FIGS. 4A and 4B.
Figure 5B:
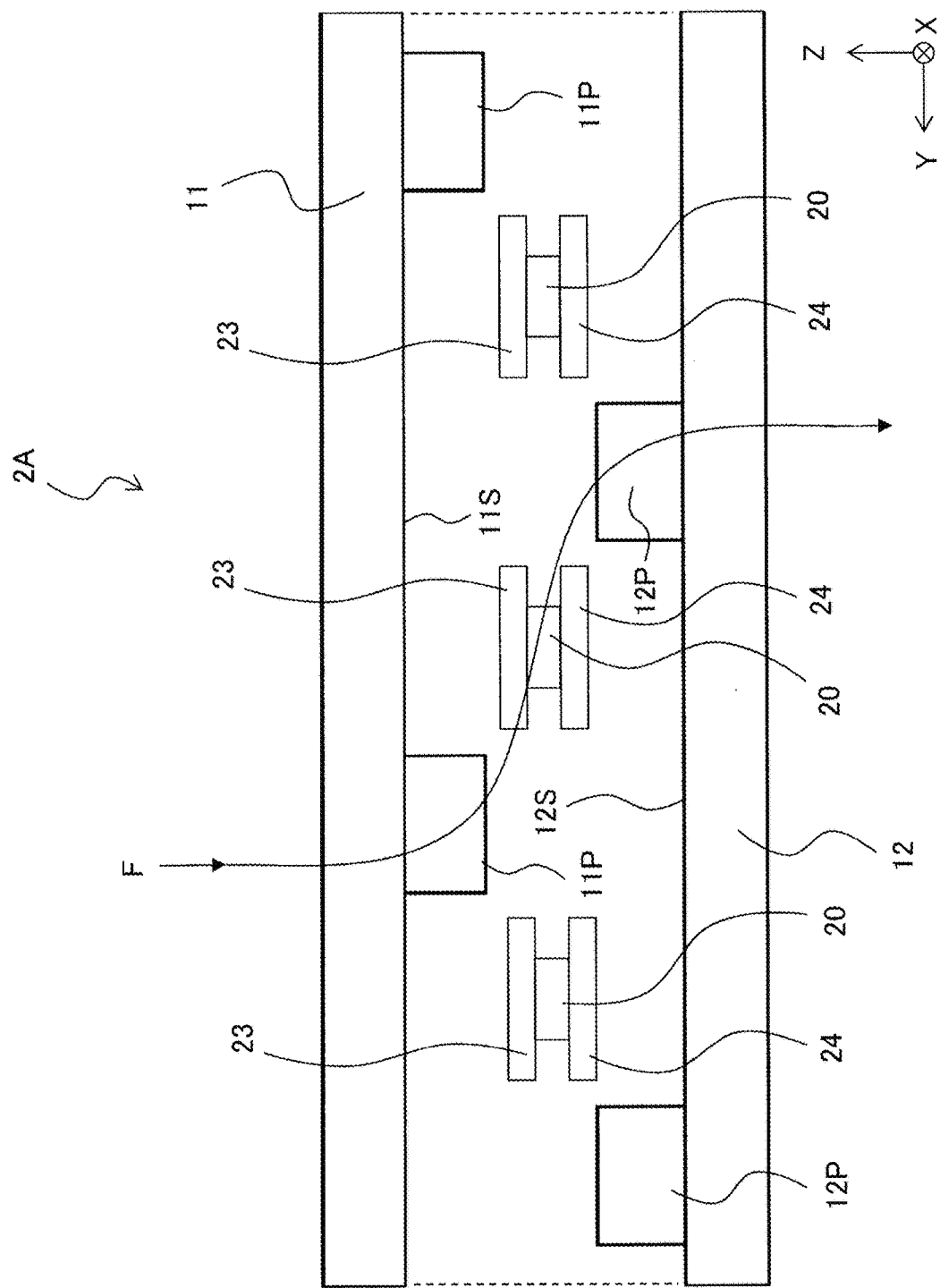
FIG. 5B is a cross-sectional view of a cross-sectional configuration of the magnetic field detection device illustrated in FIG. 5A.

Description is given next of a magnetic field detection device 2A according to a first modification example in the forgoing second embodiment, with reference to FIGS. 5A and 5B. FIG. 5A is a perspective view of an example of an overall configuration of the magnetic field detection device 2A. FIG. 5B illustrates an example of a cross-sectional configuration of the magnetic field detection device 2A viewed in a direction of an arrow along a line VB-VB illustrated in FIG. 5A.

The magnetic field detection device 2A may include a plurality of the magnetic detectors 20 interposed between the pair of the soft magnetic layers 11 and 12. FIG. 5A illustrates, as an example, the six magnetic detectors 20 arranged in two rows and three columns, but there is no limitation on the number of the plurality of the magnetic detectors 20 and their arrangements. However, in one preferable but non-limiting example, the plurality of the magnetic detectors 20 may be provided at the same level. The plurality of the magnetic detectors 20 may be serially coupled as a whole by, for example, a plurality of leads 23 and a plurality of leads 24. Moreover, the protrusion 11P or the protrusion 12P may be provided between any two adjacent ones of the magnetic detectors 20 (FIG. 5B). That way, in the magnetic field detection device 2A, it is possible to increase an output as a whole, as compared to the magnetic field detection device 2. It is to be noted that FIG. 5A omits illustration of the protrusion 11P and the protrusion 12P, for purposes of avoiding complications.

[2.3 Magnetic Field Detection Device 2B]

Figure 6:
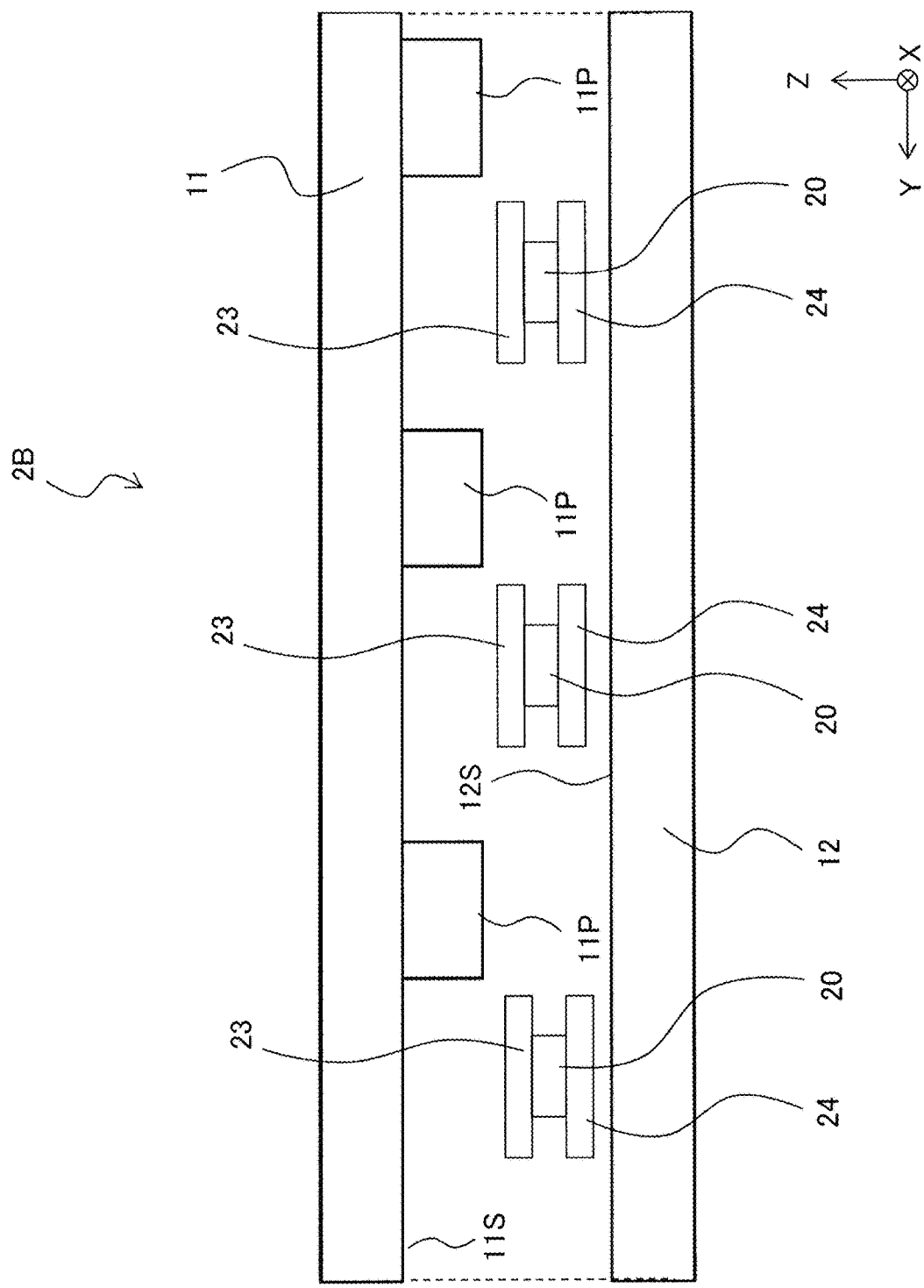
FIG. 6 is a cross-sectional view of a modification example (a second modification example) of the magnetic field detection device illustrated in FIGS. 4A and 4B.

Description is given next of a magnetic field detection device 2B according to a second modification example in the forgoing second embodiment, with reference to FIG. 6. FIG. 6 is a cross-sectional view of an example of an overall configuration of the magnetic field detection device 2B. In the forgoing magnetic field detection device 2A, the soft magnetic layer 11 may be provided with the protrusion 11P, whereas the soft magnetic layer 12 may be provided with the protrusion 12P. However, in the magnetic field detection device 2B according to this modification example, solely the soft magnetic layer 11 may be provided with the protrusion 11P. It is to be noted that solely the soft magnetic layer 12 may be provided with the protrusion 12P. In this case as well, it is possible to cause conversion of the magnetic flux of the external magnetic field component in the Z axis direction, and to guide the magnetic flux toward the magnetic detector 20, as compared to the case of the magnetic field detection device 1 according to the first embodiment that includes no protrusions.

According to the magnetic field detection device 2B of this modification example, although magnetic field detection sensitivity in the Z axis direction lowers as compared to the magnetic field detection device 2A, it is possible to enhance flexibility in installation positions of the magnetic detector 20. For example, it is possible to dispose the plurality of the magnetic detectors 20 around the single protrusion 11P. Moreover, the flat surface 12S of the soft magnetic layer 12 as a base is confronted with each of the magnetic detectors 20, making it easier to reduce variations in the plurality of the magnetic detectors 20. For example, it is easier to reduce variations in density of the magnetic fluxes that cover the respective magnetic detectors 20, or to reduce variations in detection sensitivity of the plurality of the magnetism detection devices 20. Furthermore, it is possible to eliminate a process of forming the protrusion 12P on the soft magnetic layer 12. This leads to simplification of a manufacture process of the magnetic field detection device 2B, as compared to a manufacture process of the magnetic field detection device 2A.

[2.4 Magnetic Field Detection Device 2C]

Figure 7:
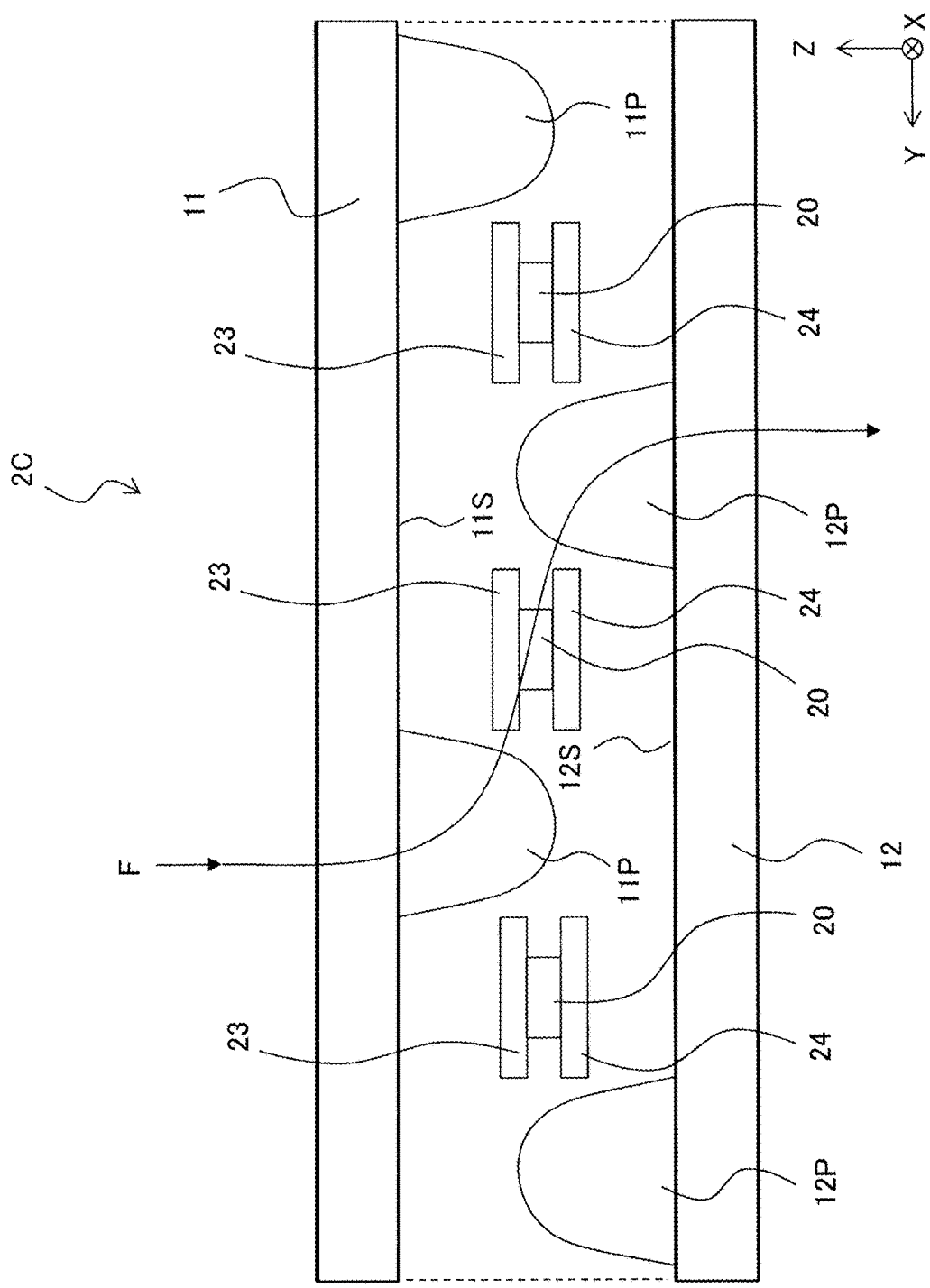
FIG. 7 is a cross-sectional view of a modification example (a third modification example) of the magnetic field detection device illustrated in FIGS. 4A and 4B.

Description is given next of a magnetic field detection device 2C according to a third modification example in the forgoing second embodiment, with reference to FIG. 7. FIG. 7 is a cross-sectional view of an example of an overall configuration of the magnetic field detection device 2C. In the forgoing magnetic field detection device 2, the soft magnetic layer 11 may be provided with the rectangular protrusion 11P, whereas the soft magnetic layer 12 may be provided with the rectangular protrusion 12P. However, the invention is not limited thereto. The magnetic field detection device 2C according to this modification example may include the protrusions 11P and 12P of a substantially circular cone shape. Heads of the protrusions 11P and 12P may have a rounded shape. Moreover, in this modification example, part of the protrusions 11P and 12P may be level with part of the magnetic detector 20, in a direction substantially parallel to the X-Y plane.

According to the magnetic field detection device 2C of this modification example, the heads of the protrusions 11P and 12P may have the rounded shapes. Thus, a spatial change in the magnetic field strength around the heads of the protrusions 11P and 12P is smoothened, in detecting, for example, the external magnetic field component in the Z axis direction. This leads to expectation of alleviation of detection errors caused by deviations of the arrangement positions of the plurality of the magnetic detectors 20.

[2.5 Magnetic Field Detection Device 2D]

Figure 8:
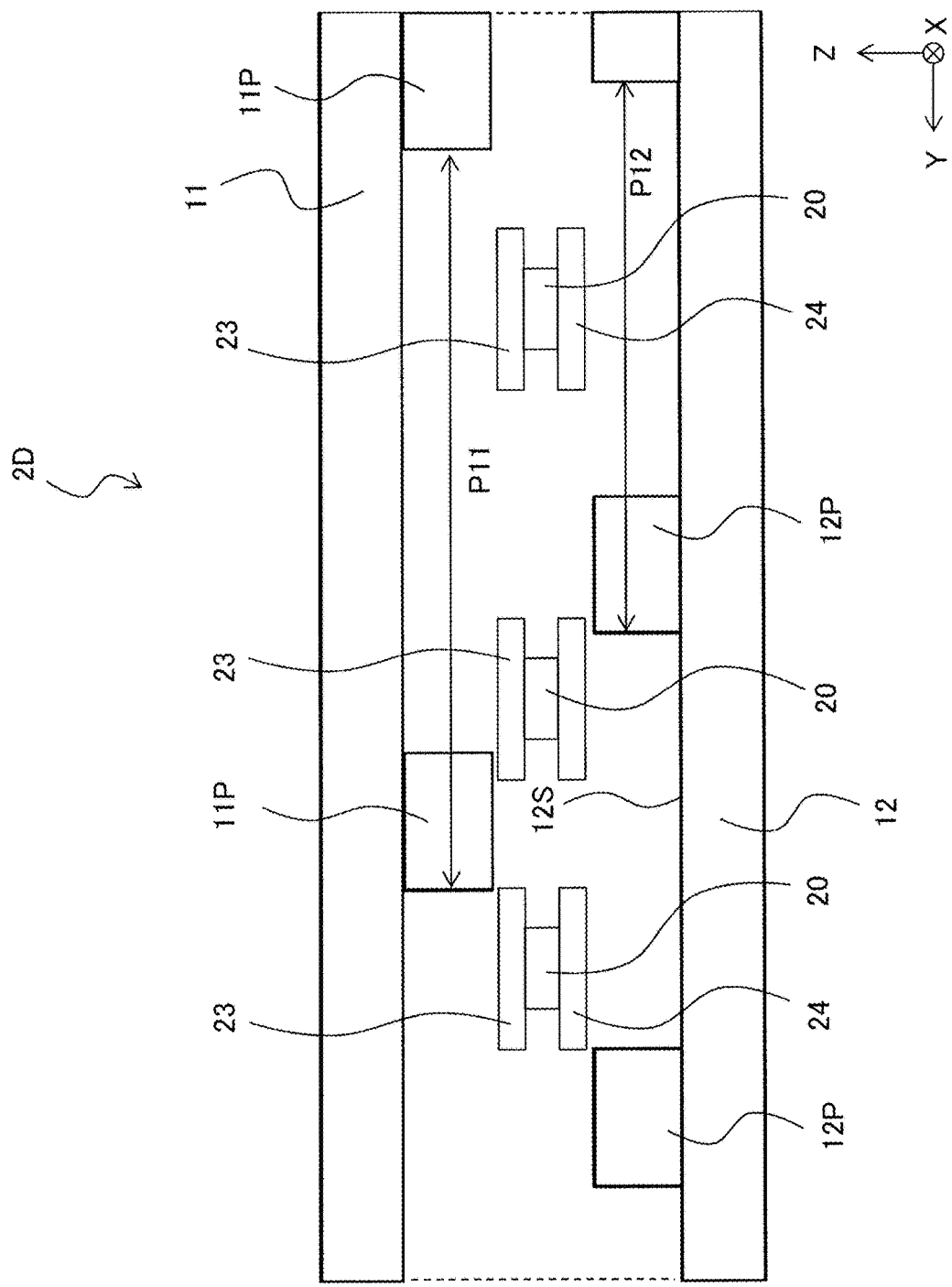
FIG. 8 is a cross-sectional view of a modification example (a fourth modification example) of the magnetic field detection device illustrated in FIGS. 4A and 4B.

Description is given next of a magnetic field detection device 2D according to a fourth modification example in the forgoing second embodiment, with reference to FIG. 8. FIG. 8 is a cross-sectional view of an example of an overall configuration of the magnetic field detection device 2D. In the forging magnetic field detection device 2A, arrangement pitches of the plurality of the protrusions 11P and arrangement pitches of the plurality of the protrusions 12P may substantially coincide with each other. The plurality of the protrusions 11P may be provided on the soft magnetic layer 11, whereas the plurality of the protrusions 12P may be provided on the soft magnetic layer 12. Meanwhile, in this modification example, the arrangement pitches of the plurality of the protrusions 11P may be different from the arrangement pitches of the plurality of the protrusions 12P. FIG. 8 illustrates an exemplary case where the arrangement pitches P11 of the plurality of the protrusions 11P are larger than the arrangement pitches P12 of the plurality of the protrusions 12P.

According to the magnetic field detection device 2D of this modification example, it is possible to adjust, as appropriate, the magnetic field detection sensitivity in each of the plurality of the magnetic detectors 20, by changing distances from each of the plurality of the magnetic detectors 20 to the protrusions 11P and the protrusions 12P.

[3. Experimental Examples]

[3.1 Experimental Examples 1-1 to 1-5]

Figure 9A:
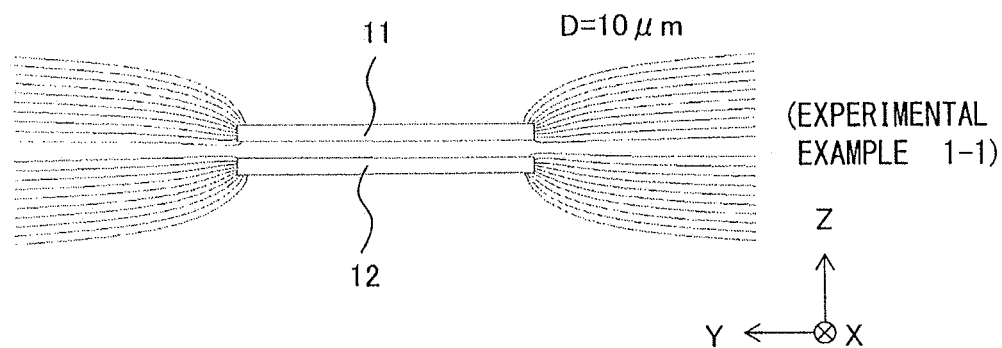
FIG. 9A is a characteristic diagram that illustrates distribution of magnetic field strength in a magnetic field detection device according to an experimental example 1-1.
Figure 9B:
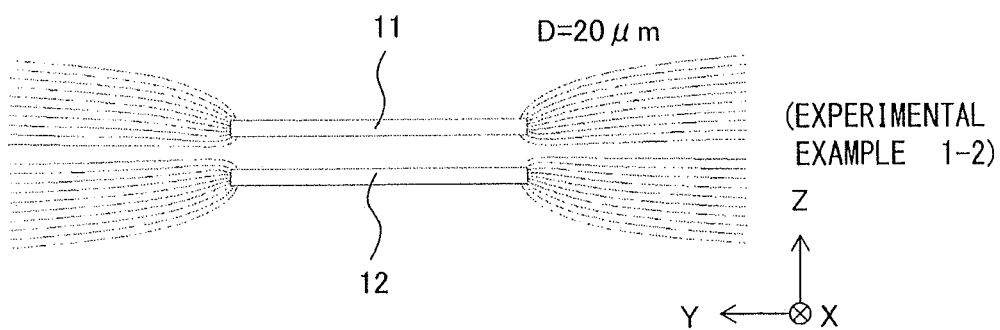
FIG. 9B is a characteristic diagram that illustrates distribution of magnetic field strength in a magnetic field detection device according to an experimental example 1-2.
Figure 9C:
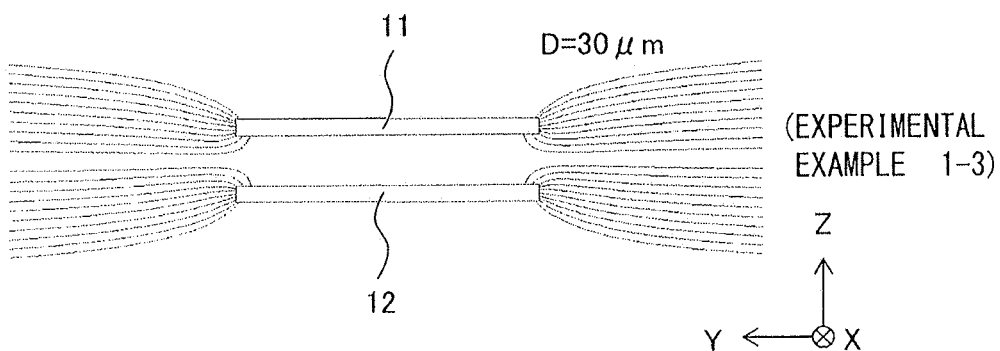
FIG. 9C is a characteristic diagram that illustrates distribution of magnetic field strength in a magnetic field detection device according to an experimental example 1-3.
Figure 9D:
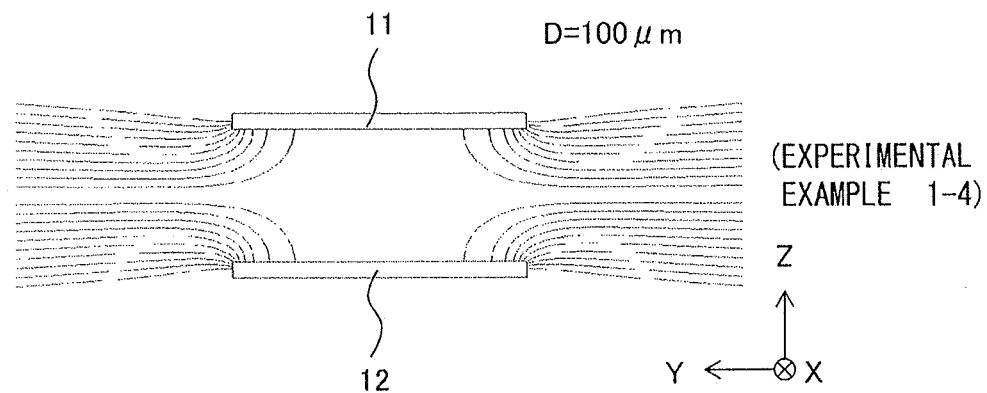
FIG. 9D is a characteristic diagram that illustrates distribution of magnetic field strength in a magnetic field detection device according to an experimental example 1-4.
Figure 9E:
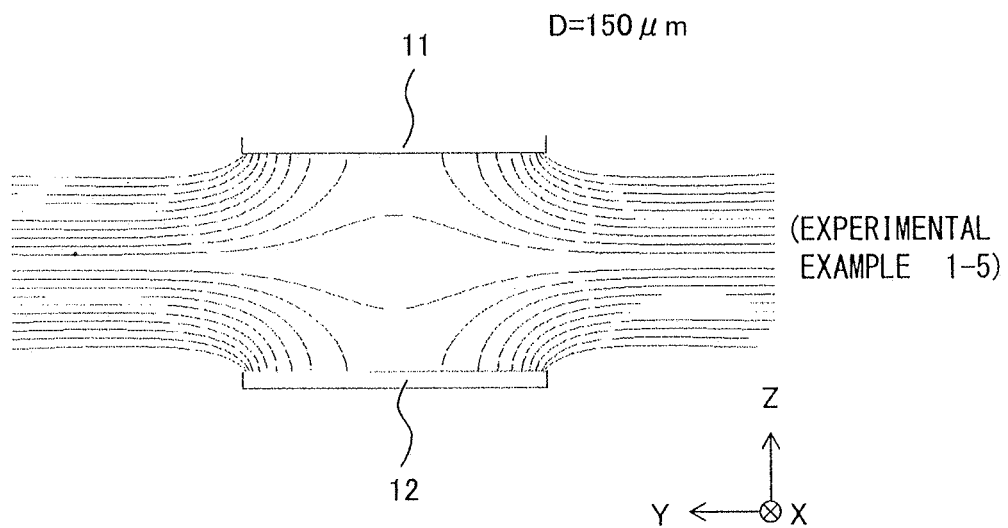
FIG. 9E is a characteristic diagram that illustrates distribution of magnetic field strength in a magnetic field detection device according to an experimental example 1-5.

Simulations were carried out, to obtain distribution of the magnetic field strength around the magnetic field detection device according to the example embodiment of the invention (e.g., the magnetic field detection device 1), with the external magnetic field in the Y axis direction being applied to the magnetic field detection device. Conditions of the simulations were as follows. In the soft magnetic layers 11 and 12, the dimension LX in the X axis direction was 180 µm. The dimension LY in the Y axis direction was 140 µm. A thickness T was 10 µm. The distance D from the soft magnetic layer 11 to the soft magnetic layer 12 was changed in a range from 10 µm to 150 µm both inclusive. Specifically, in the experimental example 1-1, the distance D was 10 µm. In the experimental example 1-2, the distance D was 20 µm. In the experimental example 1-3, the distance D was 30 µm. In the experimental example 1-4, the distance D was 100 µm. In the experimental example 1-5, the distance D was 150 µm. Results of the simulations are illustrated in FIGS. 9A to 9E. As illustrated in FIGS. 9A to 9E, as the distance D, or a gap, from the soft magnetic layer 11 to the soft magnetic layer 12 increased, the magnetic flux came little by little into space between the soft magnetic layer 11 and the soft magnetic layer 12. As illustrated in FIG. 9A, with the distance D being small, the shielding effect produced by the soft magnetic layer 11 and the soft magnetic layer 12 was extremely high, and the magnetic flux barely came into the space between the soft magnetic layer 11 and the soft magnetic layer 12. Meanwhile, as the distance D increased, confirmed was gradual intrusion of the magnetic flux at a periphery of each of the soft magnetic layer 11 and the soft magnetic layer 12 (FIGS. 9B to 9E). However, it was found that disposing the magnetic detector in the space between the soft magnetic layer 11 and the soft magnetic layer 12 made it possible for the relevant magnetic detector to produce the shielding effect against the external magnetic field in the Y axis direction.

[3.2 Experimental Examples 2-1 and 2-2]

[Experimental Example 2-1]

Simulations were carried out, to obtain the distribution of the magnetic field strength in the vicinity of ends of the soft magnetic layers 11 and 12, with the external magnetic field in the Y axis direction being applied to the magnetic field detection device according to the example embodiment of the invention (e.g., the magnetic field detection device 1). The conditions of the simulations were as follows. The thickness T of each of the soft magnetic layers 11 and 12 was 10 µm. The distance D from the soft magnetic layer 11 to the soft magnetic layer 12 was changed in a range from 10 µm to 30 µm both inclusive. Results of the simulations are illustrated in FIG. 10.

[Experimental Example 2-2]

Similar simulations to those of the Experimental Example 2-1 were carried out, except for the following conditions. The thickness T of each of the soft magnetic layers 11 and 12 was 20 µm. The distance D from the soft magnetic layer 11 to the soft magnetic layer 12 was 20 µm, 40 µm, or 60 µm. Results are illustrated in FIG. 11.

Figure 10:
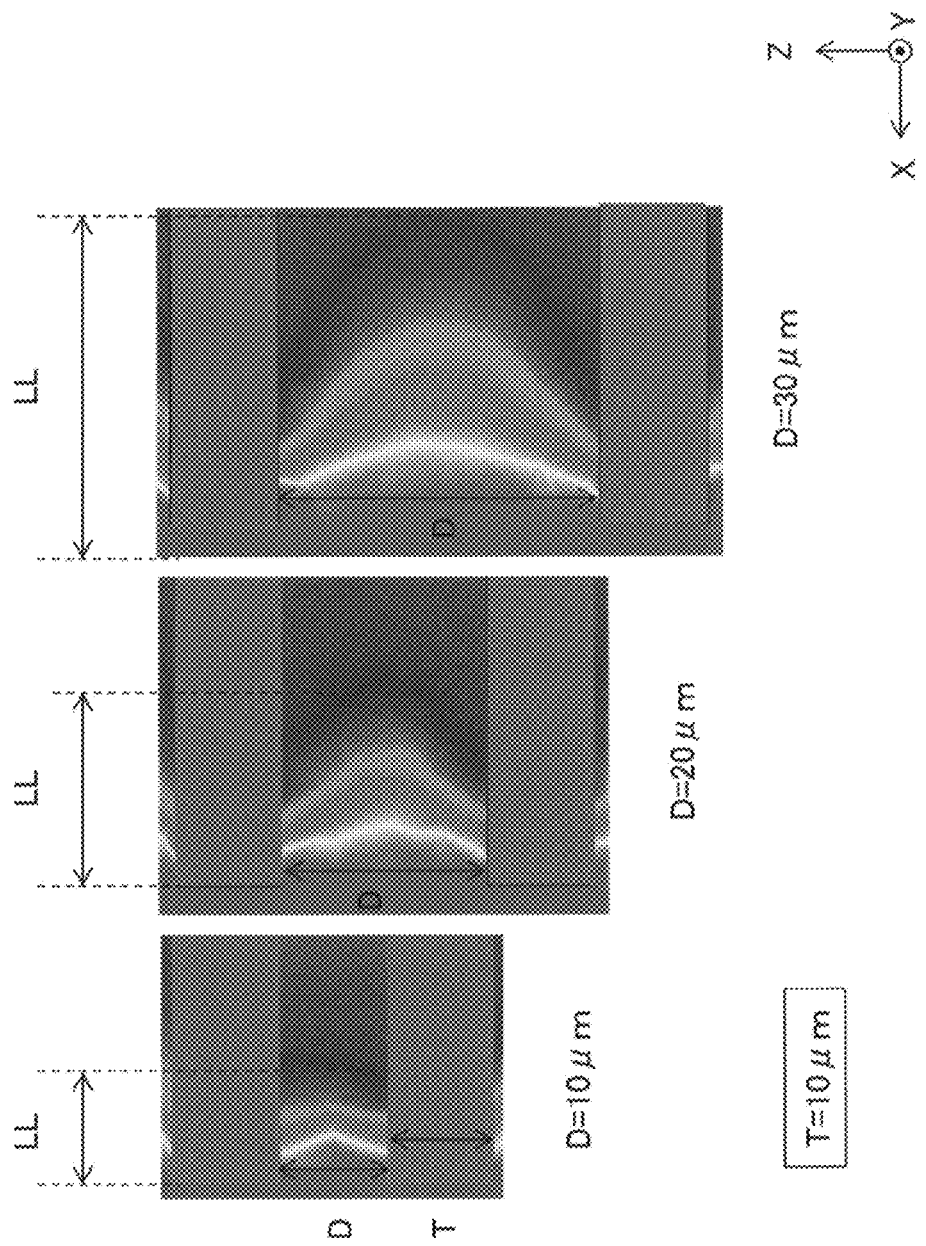
FIG. 10 is a characteristic diagram that illustrates distribution of magnetic field strength in a magnetic field detection device according to an experimental example 2-1.
Figure 11:
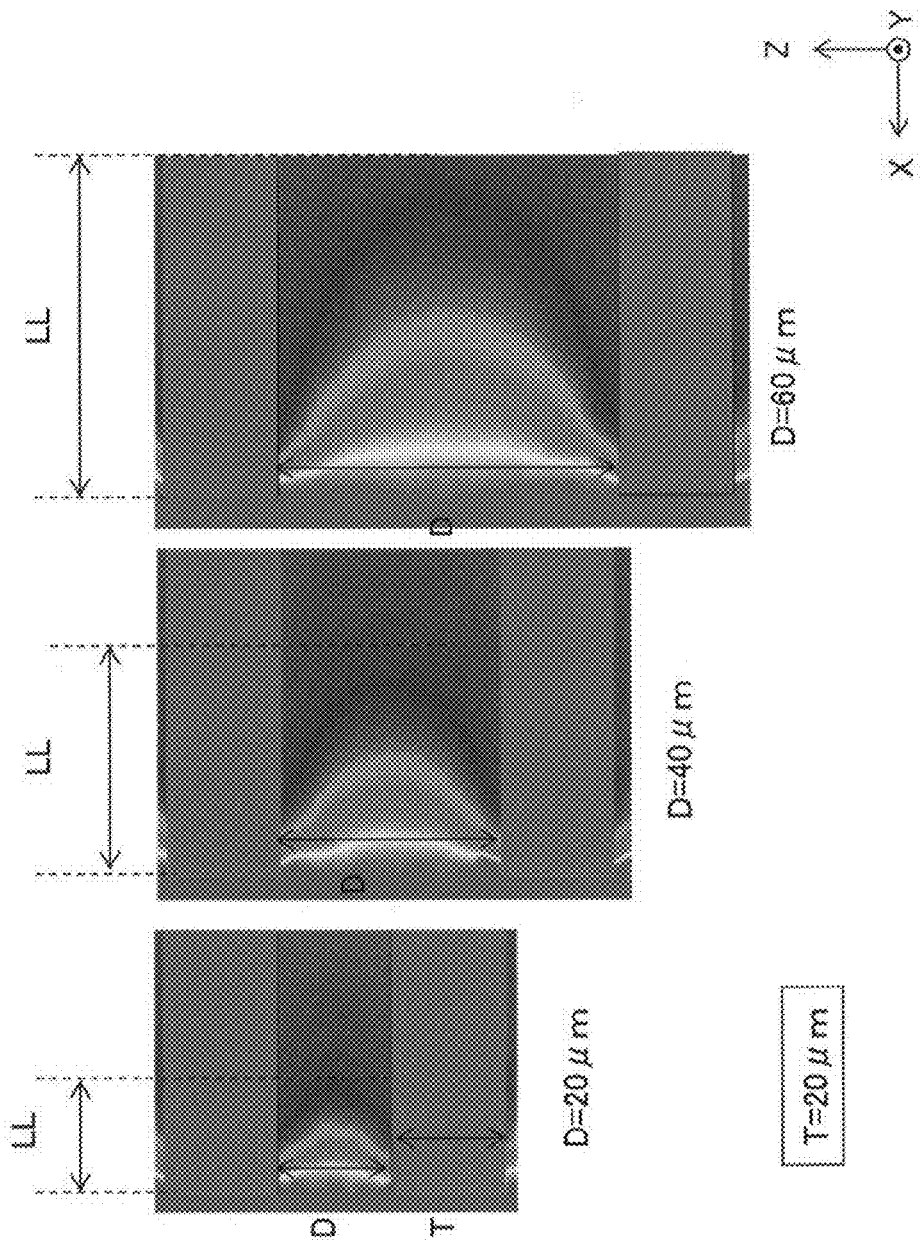
FIG. 11 is a characteristic diagram that illustrates distribution of magnetic field strength in a magnetic field detection device according to an experimental example 2-2.

From the results in FIGS. 10 and 11, it was found that an intrusion length LL was about a half of the distance D (LL≈D/2). The intrusion length LL is a distance from the edge of the soft magnetic layer 11 or 12 to a region with substantially constant magnetic field strength. It was therefore found that disposing the magnetic detector 20 at a position retreating from the edge of the soft magnetic layer 11 or 12 by an amount equal to or larger than a half of a length corresponding to the distance D made it possible to make more precise magnetic field detection.

[3.3 Experimental Examples 3-1 to 3-8]

Simulations were carried out, to obtain critical magnetic field strength of the soft magnetic layers 11 and 12, with the external magnetic field in the Y axis direction being applied to the magnetic field detection device according to the example embodiment of the invention (e.g., the magnetic field detection device 1). The conditions of the simulations were as follows. The thickness T of each of the soft magnetic layers 11 and 12 was 10 µm. The distance D from the soft magnetic layer 11 to the soft magnetic layer 12 was 10 µm. The dimension LY of each of the soft magnetic layers 11 and 12 was 200 µm. The dimension LX of each of the soft magnetic layers 11 and 12 was changed in a range from 20 µm to 800 µm both inclusive (i.e., in a range of LX/LY=0.1 to 4 both inclusive). Results of the simulations were illustrated in FIG. 12.

Figure 12:
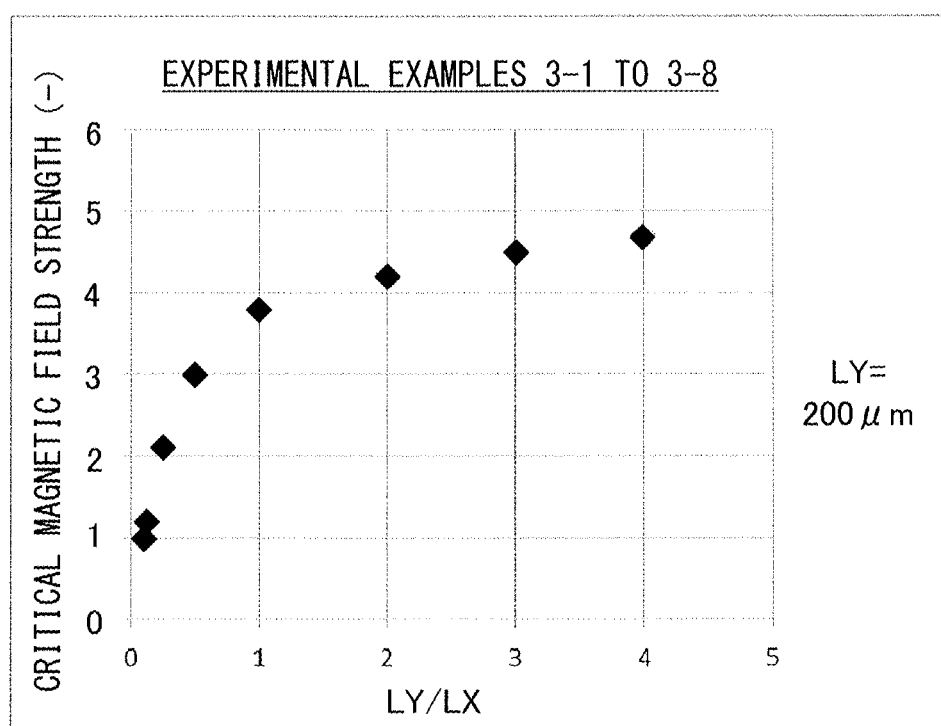
FIG. 12 is a characteristic diagram that illustrates critical magnetic field strength in magnetic field detection devices according to experimental examples 3-1 to 3-8.
Figure 13A:
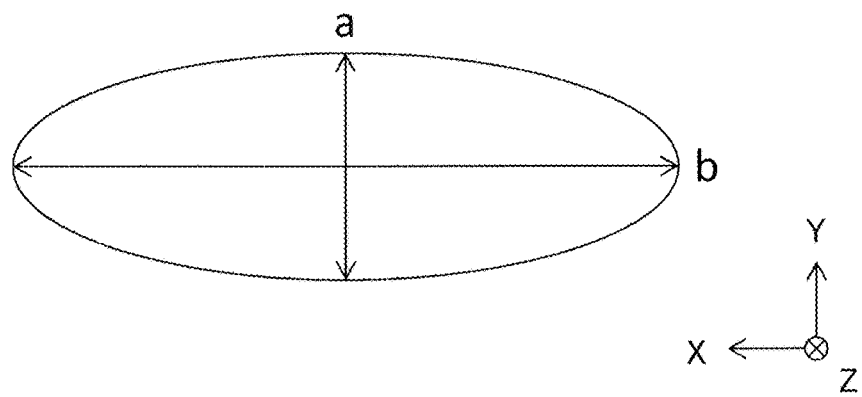
FIG. 13A is a schematic diagram that illustrates a first modification example of a planar shape of a soft magnetic body.
Figure 13B:
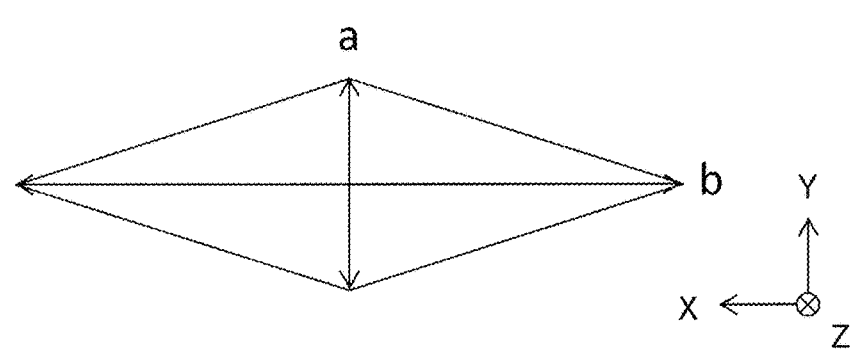
FIG. 13B is a schematic diagram that illustrates a second modification example of a planar shape of a soft magnetic body.
Figure 13C:
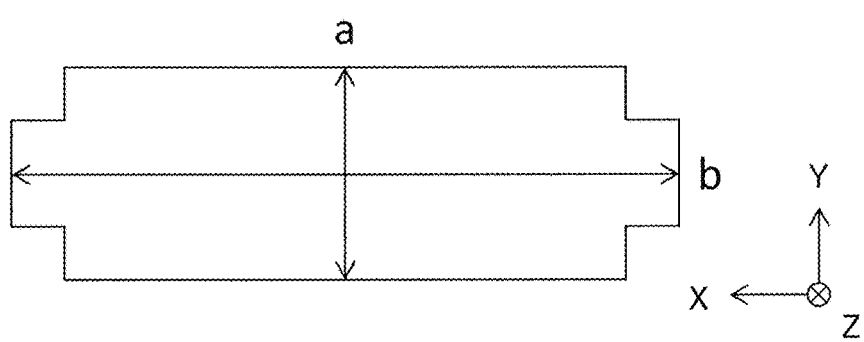
FIG. 13C is a schematic diagram that illustrates a third modification example of a planar shape of a soft magnetic body.
Figure 13D:
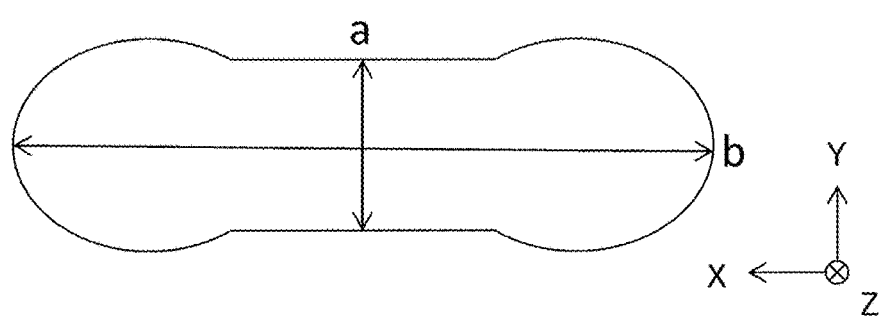
FIG. 13D is a schematic diagram that illustrates a fourth modification example of a planar shape of a soft magnetic body.

As illustrated in FIG. 12, it was confirmed that higher critical magnetic field strength was obtained, in a case where LX/LY ranged from 1 to 4 both inclusive, as compared to a case where LX/LY was smaller than 1.

[4. Other Modification Examples]

Although the invention has been described in the foregoing by way of example with reference to the example embodiments and the modification examples, the technology of the invention is not limited thereto but may be modified in a wide variety of ways. For example, in the technology of the invention, the shape of the soft magnetic layers is not limited to those as described in the forgoing example embodiments. For example, the planar shape is not limited to rectangles. As illustrated in FIGS. 13A to 13D, various shapes may be adopted. In these cases as well, it is desirable that a ratio of an in-plane maximum dimension b to a dimension a in a direction orthogonal to a dimension including the in-plane maximum dimension b fall within a predetermined range.

Figure 14A:
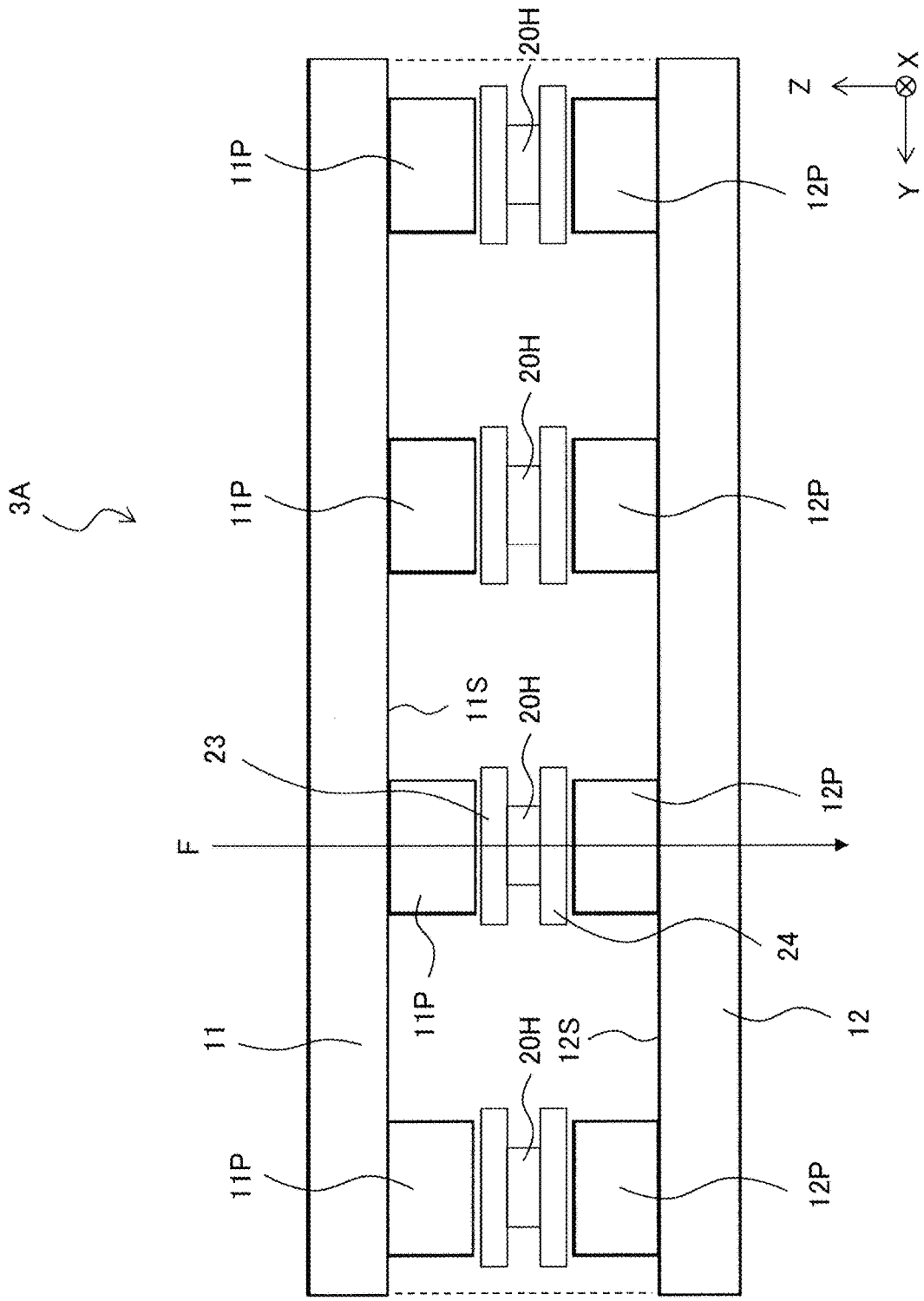
FIG. 14A is a cross-sectional view of a magnetic field detection device according to a fifth modification example.
Figure 14B:
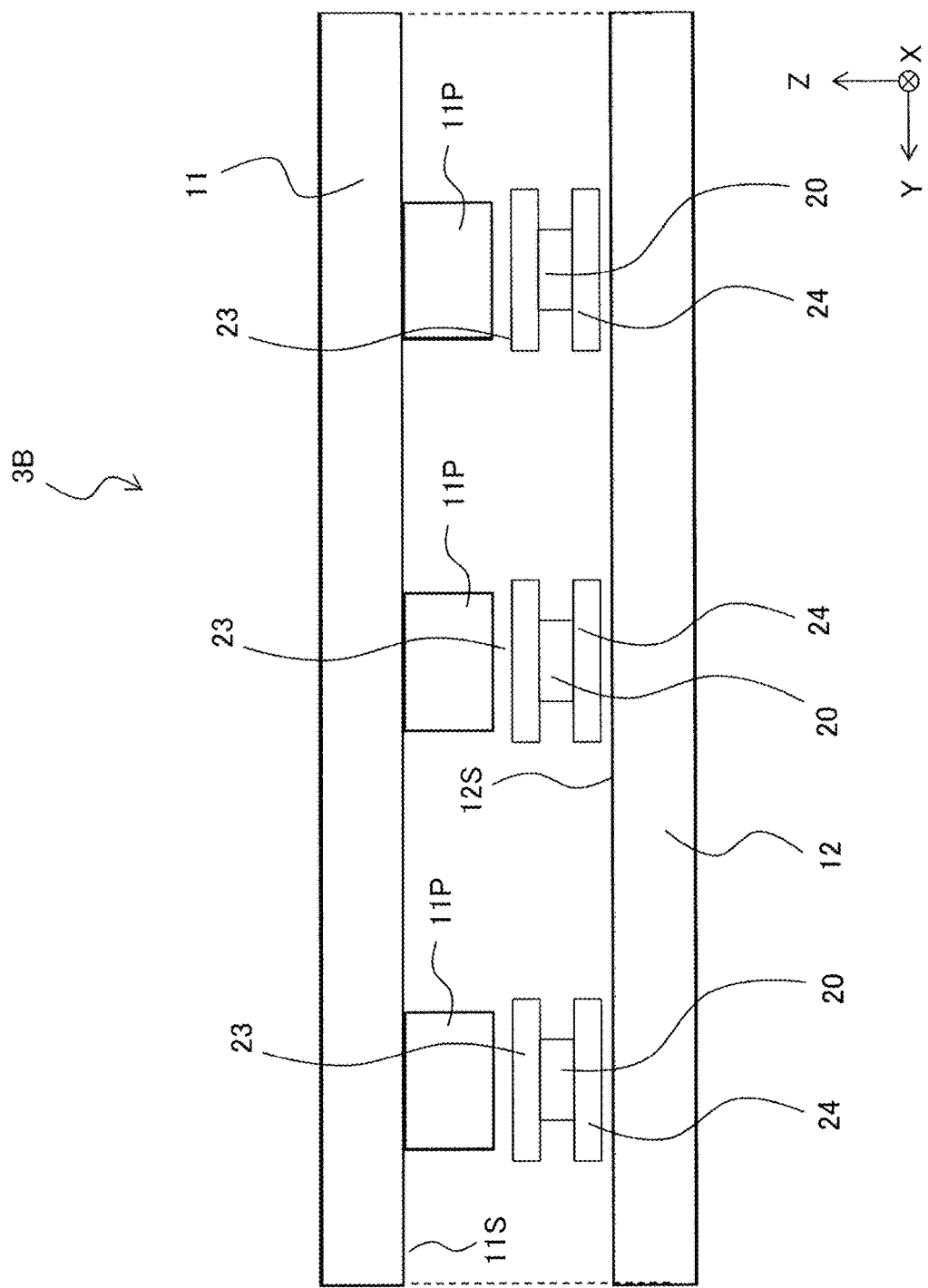
FIG. 14B is a cross-sectional view of a magnetic field detection device according to a sixth modification example.

Moreover, in the forgoing example embodiments, description is given with exemplification of the CPP MR element having the spin valve structure in which the direction of the magnetic sensing is the in-plane direction of the X-Y plane. However, the technology of the invention is not limited thereto. For example, a current in plane (CIP) MR element or an MTJ element may be used. Other sensors than the MR elements may be also used. For example, a sensor such as a magnetic detector in which the direction of the magnetic sensing is the Z axis direction may be also used. Non-limiting examples may include a Hall element. For example, FIGS. 14A and 14B illustrate a magnetic field detection device 3A and a magnetic field detection device 3B. In a case where the Hall element is utilized as the magnetic detector, as exemplified in FIGS. 14A and 14B, the Hall element 20H may be disposed at a position superposed in the Z axis direction on the protrusion 11P or 12P (the protrusion). In other words, the Hall element 20H may be disposed directly above or directly below the protrusion 11P or 12P (the protrusion).

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A magnetic field detection device, including:
a first soft magnetic body and a second soft magnetic body that extend along a first plane and are disposed in confronted relation in a third direction, the first plane including both a first direction and a second direction orthogonal to the first direction, and the third direction orthogonal to both the first direction and the second direction; and
a magnetic detector provided between the first soft magnetic body and the second soft magnetic body in the third direction.

(2) The magnetic field detection device according to (1), in which
in the first soft magnetic body, the second soft magnetic body, or both, the following conditional expression [1] is satisfied, $$1 \leq LX/LY \leq 4 \quad [1]$$

where LX denotes a dimension in the first direction, and LY denotes a dimension in the second direction.

(3) The magnetic field detection device according to (1) or (2), in which the magnetic detector is a magneto-resistive effect element.

(4) The magnetic field detection device according to any one of (1) to (3), in which
the first soft magnetic body includes a first confronted surface that is confronted with the second soft magnetic body,
the second soft magnetic body includes a second confronted surface that is confronted with the first soft magnetic body, a first angle formed by a first straight line with respect to the first plane is equal to or smaller than 45°, the first straight line coupling the magnetic detector to an edge of the first confronted surface, and
a second angle formed by a second straight line with respect to the first plane is equal to or smaller than 45°, the second straight line coupling the magnetic detector to an edge of the second confronted surface.

(5) The magnetic field detection device according to (4), in which
a position of the edge of the first confronted surface and a position of the edge of the second confronted surface substantially coincide in the third direction, and
the following conditional expression [2] is satisfied, $$L \geq D/2 \quad [2]$$

where L denotes a distance from the edge of the first confronted surface to an edge of the magnetic detector, in a direction along the first plane, and D denotes a distance from the first confronted surface to the second confronted surface.

(6) The magnetic field detection device according to any one of (1) to (5), in which
the first soft magnetic body includes a first confronted surface that is confronted with the second soft magnetic body,
the second soft magnetic body includes a second confronted surface that is confronted with the first soft magnetic body,
the first confronted surface, the second confronted surface, or both include one or more protrusions.

(7) The magnetic field detection device according to (6), in which
part of the one or more protrusions is level with part of the magnetic detector, in a direction substantially parallel to the first plane.

(8) The magnetic field detection device according to any one of (1) to (7), in which
a first planar shape of the first soft magnetic body is substantially equal to a second planar shape of the second soft magnetic body, the first planar shape being parallel to the first plane, and the second planar shape being parallel to the first plane.

(9) The magnetic field detection device according to (2), in which
the second direction substantially coincides with a direction of an unwanted magnetic field component other than a magnetic field component as a target of detection.

According to a magnetic field detection device of one illustrative embodiment of the invention, a first soft magnetic body and a second soft magnetic body are provided, with a magnetic detector held therebetween in a third direction. Accordingly, the first soft magnetic body and the second soft magnetic body both act as magnetic yokes, with respect to an external magnetic field component in the third direction. Meanwhile, the first soft magnetic body and the second soft magnetic body both act as magnetic shields, with respect to an external magnetic field component along a first plane.

According to the magnetic field detection device of the illustrative embodiment of the invention, in the first soft magnetic body, the second soft magnetic body, or both, the following conditional expression [1] may be satisfied, $$1 \leq LX/LY \leq 4 \quad [1]$$

in which LX denotes a dimension in a first direction, and LY denotes a dimension in a second direction.

This causes enhancement in critical magnetic field strength with respect to a magnetic field in the second direction in the first soft magnetic body, the second soft magnetic body, or both, leading to further enhancement in a magnetic shielding effect with respect to the magnetic field in the second direction along the first plane. It is to be noted that the "critical magnetic field strength" as used here refers to strength of an external magnetic field at which magnetization of the relevant magnetic body (in this case, the first soft magnetic body and the second soft magnetic body) is saturated.

According to the magnetic field detection device of the illustrative embodiment of the invention, the magnetic detector may be a magneto-resistive effect element. Moreover, the first soft magnetic body may include a first confronted surface that is confronted with the second soft magnetic body, whereas the second soft magnetic body may include a second confronted surface that is confronted with the first soft magnetic body. A first angle formed by a first straight line with respect to the first plane may be equal to or smaller than 45°. The first straight line couples the magnetic detector to an edge of the first confronted surface. A second angle formed by a second straight line with respect to the first plane may be equal to or smaller than 45°. The second straight line couples the magnetic detector to an edge of the second confronted surface. In this case, a position of the edge of the first confronted surface and a position of the edge of the second confronted surface may substantially coincide in the third direction, and the following conditional expression [2] may be satisfied, $$L \geq D/2 \quad [2]$$

in which L denotes a distance from the edge of the first confronted surface to an edge of the magnetic detector, in a direction along the first plane, and D denotes a distance from the first confronted surface to the second confronted surface.

According to the magnetic field detection device of the illustrative embodiment of the invention, the first confronted surface, the second confronted surface, or both may include one or more protrusions. In this case, part of the one or more protrusions may be level with part of the magnetic detector, in a direction substantially parallel to the first plane.

According to the magnetic field detection device of the illustrative embodiment of the invention, the first soft magnetic body and the second soft magnetic body exhibit a shielding effect with respect to the external magnetic field component along the first plane, while enhancing the external magnetic field component in the third direction. Hence, it is possible to exhibit high performance in magnetic field detection, with respect to the external magnetic field component in the third direction.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly on the basis of the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A magnetic field detection device, comprising:
    a first soft magnetic body and a second soft magnetic body that extend along a first plane and are disposed in confronted relation in a third direction with a non-magnetic layer in between, the first plane including both a first direction and a second direction orthogonal to the first direction, and the third direction orthogonal to both the first direction and the second direction;
    a magnetic detector provided between the first soft magnetic body and the second soft magnetic body in the third direction and separated from both of the first soft magnetic body and the second soft magnetic body: and
    a pair of leads sandwiching the magnetic detector in the third direction and configured to supply sense current to the magnetic detector in the third direction,
    wherein the first soft magnetic body includes a first confronted surface that is confronted with the second soft magnetic body,
    the second soft magnetic body includes a second confronted surface that is confronted with the first soft magnetic body,
    the first confronted surface, the second confronted surface, or both include a plurality of protrusions, or both the first confronted surface and the second confronted surface include one or more protrusions,
    the magnetic detector includes a direction of magnetic sensing along the first plane, and
    the magnetic detector and the pair of leads are provided in an area between two adjacent protrusions along the first plane without overlapping any of the plurality of protrusions in the third direction.

2. The magnetic field detection device according to claim 1, wherein in the first soft magnetic body, the second soft magnetic body, or both, the following conditional expression [1] is satisfied, $$1 \leq LX/LY \leq 4 \quad [1]$$

where LX denotes a dimension in the first direction, and LY denotes a dimension in the second direction.

3. The magnetic field detection device according to claim 2, wherein the second direction substantially coincides with a direction of an unwanted magnetic field component other than a magnetic field component as a target of detection.

4. The magnetic field detection device according to claim 1, wherein the magnetic detector is a magneto-resistive effect element.

5. The magnetic field detection device according to claim 1, wherein
    a first angle formed by a first straight line with respect to the first plane is equal to or smaller than 45°, the first straight line coupling the magnetic detector to an edge of the first confronted surface, and
    a second angle formed by a second straight line with respect to the first plane is equal to or smaller than 45°, the second straight line coupling the magnetic detector to an edge of the second confronted surface.

6. The magnetic field detection device according to claim 5, wherein a position of the edge of the first confronted surface and a position of the edge of the second confronted surface substantially coincide in the third direction, and the following conditional expression [2] is satisfied, $$L \geq D/2 \qquad [2]$$

where L denotes a distance from the edge of the first confronted surface to an edge of the magnetic detector, in a direction along the first plane, and D denotes a distance from the first confronted surface to the second confronted surface.

7. The magnetic field detection device according to claim 1, wherein a first planar shape of the first soft magnetic body is substantially equal to a second planar shape of the second soft magnetic body, the first planar shape being parallel to the first plane, and the second planar shape being parallel to the first plane.

8. The magnetic field detection device according to claim 1, wherein the magnetic detector is provided at a different position from an intermediate position between the two adjacent protrusions along the first plane.

9. A magnetic field detection device, comprising:

a first soft magnetic body and a second soft magnetic body that extend along a first plane and are disposed in confronted relation in a third direction with a non-magnetic layer in between, the first plane including both a first direction and a second direction orthogonal to the first direction, and the third direction orthogonal to both the first direction and the second direction;

a magnetic detector provided between the first soft magnetic body and the second soft magnetic body in the third direction and separated from both of the first soft magnetic body and the second soft magnetic body; and a pair of leads sandwiching the magnetic detector in the third direction and configured to supply sense current to the magnetic detector in the third direction, wherein the first soft magnetic body includes a first confronted surface that is confronted with the second soft magnetic body, the second soft magnetic body includes a second confronted surface that is confronted with the first soft magnetic body, the first confronted surface, the second confronted surface, or both include a plurality of protrusions, or both the first confronted surface and the second confronted surface include one or more protrusions, the magnetic detector includes a direction of magnetic sensing along the first plane, a center position of the magnetic detector in a direction along the first plane is a different position from a position overlapping with a protrusion in the third direction, and the pair of leads are provided in an area between two adjacent yokes along the first plane without overlapping any of the plurality of yokes in the third direction.

* * * * *

UNITED STATES PATENT AND TRADEMARK OFFICE
CERTIFICATE OF CORRECTION

Page 1 of 1

PATENT NO. : 10,761,150 B2
APPLICATION NO. : 15/688093
DATED : September 1, 2020
INVENTOR(S) : Masaki Nagata et al.

It is certified that error appears in the above-identified patent and that said Letters Patent is hereby corrected as shown below:

In the Claims

Column 16, Claim number 9, Line numbers 25-26:
"adjacent yokes along the first plane without overlapping any of the plurality of yokes in the third direction."
Should be:
-- "adjacent protrusions along the first plane without overlapping any of the plurality of protrusions in the third direction." --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*